United States Patent
Ito et al.

(10) Patent No.: US 7,138,931 B2
(45) Date of Patent: Nov. 21, 2006

(54) RECORDING AND REPRODUCING APPARATUS

(75) Inventors: Toshio Ito, Kawasaki (JP); Masaru Sawada, Kawasaki (JP); Toshihiko Morita, Kawasaki (JP); Takao Sugawara, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/982,610

(22) Filed: Nov. 5, 2004

(65) Prior Publication Data

US 2005/0225458 A1    Oct. 13, 2005

(30) Foreign Application Priority Data

Apr. 12, 2004  (JP) .............................. 2004-117239

(51) Int. Cl.
*H03M 7/00*     (2006.01)

(52) U.S. Cl. ..................................................... 341/59
(58) Field of Classification Search ................. 341/59, 341/58, 50, 68, 69; 360/32, 48
See application file for complete search history.

(56) References Cited

U.S. PATENT DOCUMENTS

| | | | |
|---|---|---|---|
| 5,220,568 A * | 6/1993 | Howe et al. ................. | 714/782 |
| 6,104,324 A * | 8/2000 | Kim ............................ | 341/58 |
| 6,130,629 A | 10/2000 | Aziz et al. | |
| 6,456,208 B1 | 9/2002 | Nazari et al. | |
| 2003/0043487 A1 | 3/2003 | Morita et al. | |
| 2003/0066020 A1 | 4/2003 | Morita et al. | |

FOREIGN PATENT DOCUMENTS

JP    2003-068024    3/2003

OTHER PUBLICATIONS

A.J. van Wijngaarden et al; "On the Construction of Constrained Codes Employing Sequence Replacement Techniques"; Proc. IEEE ISIT97, Ulm, Germany; p. 144; Jun. 29, 1997.
Siegel, P. H., et al. "Modulation and Coding for Information Storage", IEEE Communications Magazine, IEEE Service Center, Piscataway, N.J. U.S., vol. 29, No. 12, Dec. 1, 1991, pp. 68-86.
Schouhamer, Immink, K.A., et al. "Codes for Digital Recorders", IEEE Transactiosn on Information Theory, vol. 44, No. 6, Oct. 1998, pp. 2260-2299.
Van Wijngaarden A.J., et al. "On the Construction of Controlled Codes Employing Sequence Replacement Techniques", Information Theory, 1997, Proceedings., 1997 IEEE International Symposium on ULM, Germany Jun. 29-Jul. 4, 1997, New York, NY, USA, IEEE U.S. Jun. 29, 1997, p. 144.
Schouhamer Immink, K.A., et al. "Simple High-Rate Constrained Codes", Electronics Letters, IEE Stevenage, GB, vol. 32, No. 20, Sep. 26, 1996, pp. 1877-1877.

* cited by examiner

*Primary Examiner*—Brian Young
(74) *Attorney, Agent, or Firm*—Greer, Burns & Crain, Ltd.

(57) ABSTRACT

A recording and reproducing apparatus includes an RLL encoder that encodes an information bit string to a code bit string and a RLL decoder that decodes the code bit string to the information bit string. The RLL encoder encodes the information bit string to the code bit string of a run-length-limited code at a high encoding rate satisfying a plurality of conditions of constraint regarding a string of successive zeros. The RLL decoder decodes the code bit string encoded by the RLL encoder to the information bit string.

22 Claims, 29 Drawing Sheets

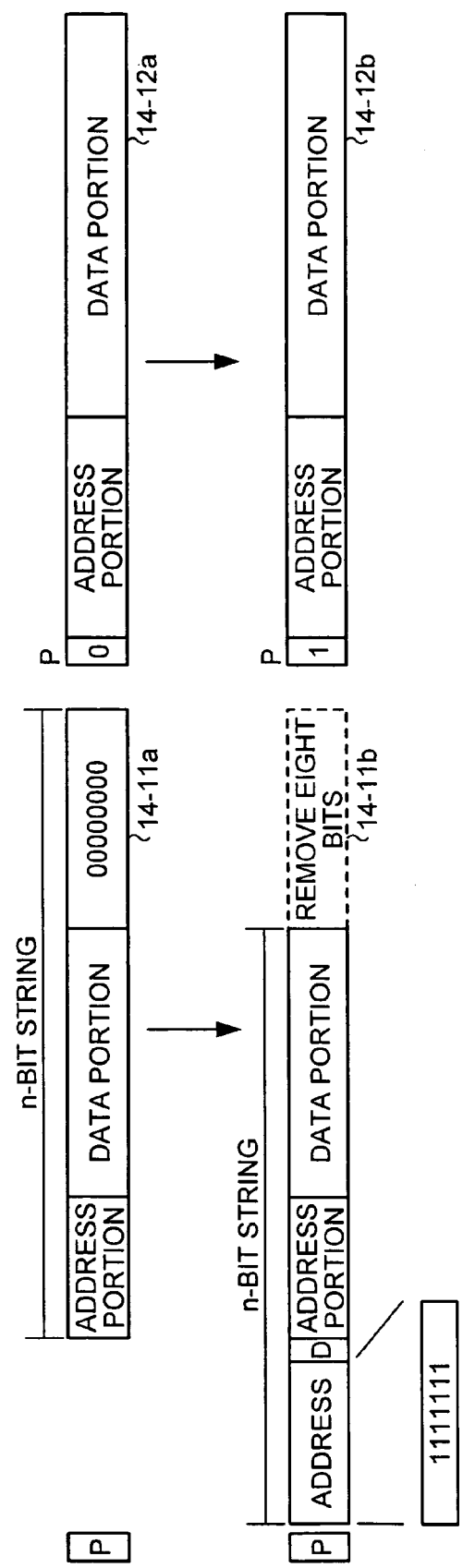

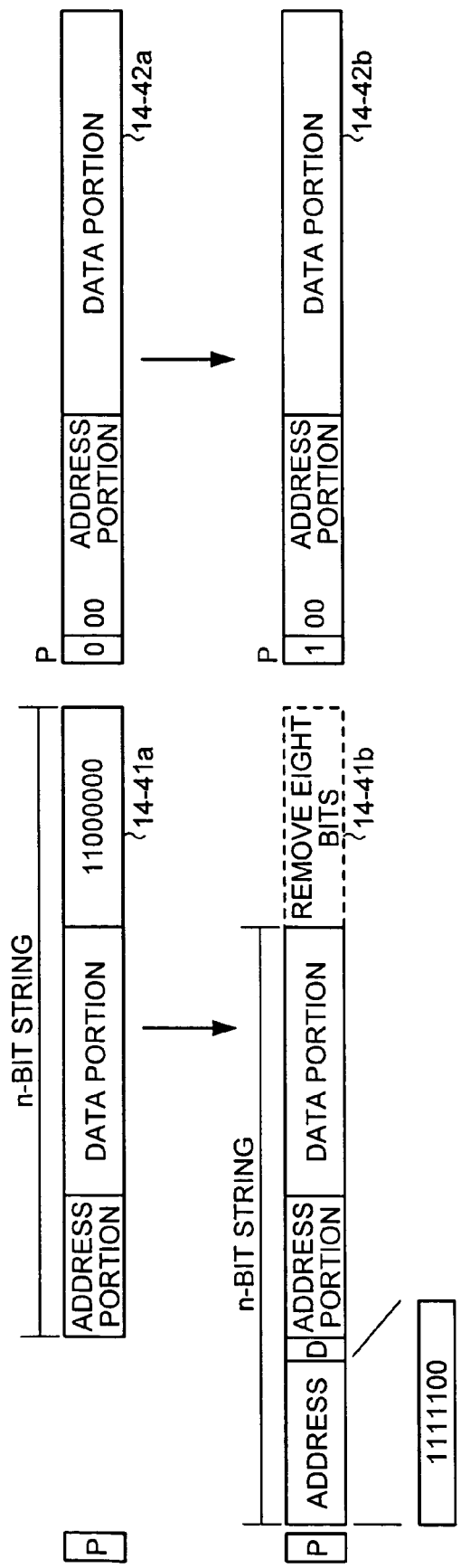

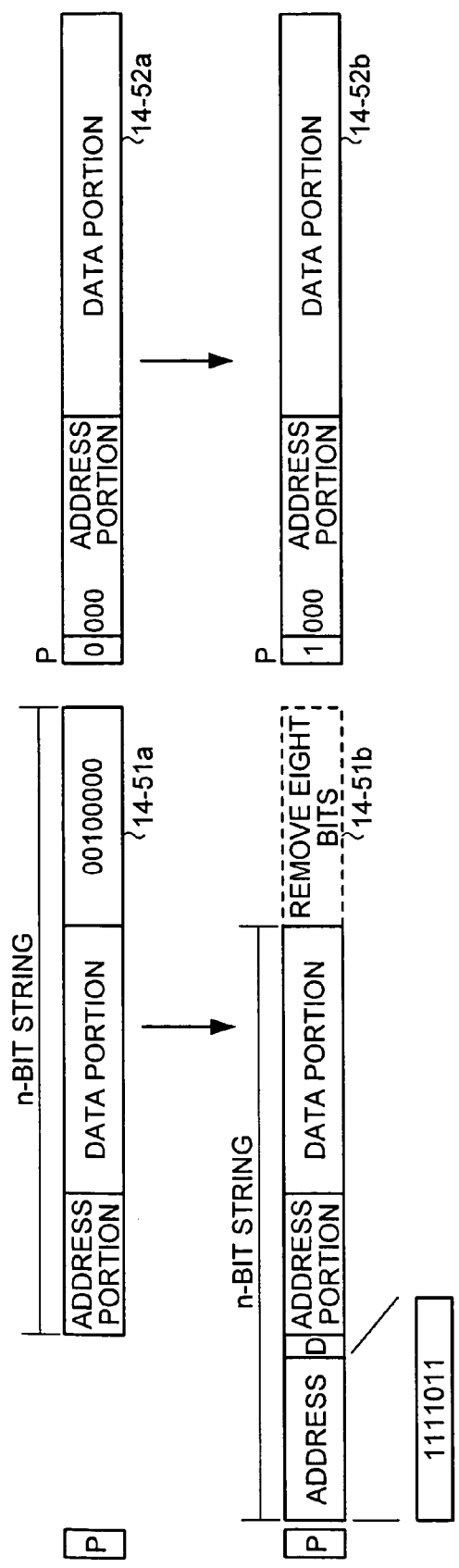

FIG.14

15 ADDRESS-CODE CONVERSION TABLE BEFORE INTERLEAVE PROCESS

| '10'-PATTERN COUNTER VALUE | ADDRESS CODE | i | F1(i) | i | F1(i) |
|---|---|---|---|---|---|
| i | F1(i) | | | | |
| 1 | 00001001 | 26 | 00100101 | 51 | 01000000 |
| 2 | 00001011 | 27 | 00100110 | 52 | 01000001 |
| 3 | 00001100 | 28 | 00100111 | 53 | 01000010 |
| 4 | 00001101 | 29 | 00101001 | 54 | 01000011 |
| 5 | 00001110 | 30 | 00101011 | 55 | 01000100 |
| 6 | 00001111 | 31 | 00101100 | 56 | 01000101 |
| 7 | 00010000 | 32 | 00101101 | 57 | 01000110 |
| 8 | 00010001 | 33 | 00101110 | 58 | 01000111 |
| 9 | 00010010 | 34 | 00101111 | 59 | 01001000 |
| 10 | 00010011 | 35 | 00110000 | 60 | 01001001 |
| 11 | 00010100 | 36 | 00110001 | 61 | 01001010 |
| 12 | 00010101 | 37 | 00110010 | 62 | 01001011 |
| 13 | 00010110 | 38 | 00110011 | 63 | 01001100 |
| 14 | 00010111 | 39 | 00110100 | 64 | 01001101 |
| 15 | 00011000 | 40 | 00110101 | 65 | 01001110 |
| 16 | 00011001 | 41 | 00110110 | 66 | 01001111 |
| 17 | 00011010 | 42 | 00110111 | 67 | 01010000 |
| 18 | 00011011 | 43 | 00111000 | 68 | 01010001 |
| 19 | 00011100 | 44 | 00111001 | 69 | 01010010 |
| 20 | 00011101 | 45 | 00111010 | 70 | 01010011 |
| 21 | 00011110 | 46 | 00111011 | 21 | 01010100 |
| 22 | 00011111 | 47 | 00111100 | 72 | 01010101 |
| 23 | 00100001 | 48 | 00111101 | 73 | 01010110 |
| 24 | 00100011 | 49 | 00111110 | 74 | 01010111 |
| 25 | 00100100 | 50 | 00111111 | 75 | 01011000 |

FIG.15

16 ADDRESS-CODE CONVERSION TABLE AFTER INTERLEAVE PROCESS

| '10'-PATTERN COUNTER VALUE | ADDRESS CODE | i | F2(i) | i | F2(i) |
|---|---|---|---|---|---|
| i | F2(i) | | | | |
| 1 | 00001001 | 26 | 00101011 | 51 | 01001000 |
| 2 | 00001011 | 27 | 00101100 | 52 | 01001001 |
| 3 | 00001100 | 28 | 00101101 | 53 | 01001010 |
| 4 | 00001101 | 29 | 00101110 | 54 | 01001011 |
| 5 | 00001110 | 30 | 00101111 | 55 | 01001100 |
| 6 | 00001111 | 31 | 00110000 | 56 | 01001101 |
| 7 | 00010010 | 32 | 00110001 | 57 | 01001110 |
| 8 | 00010011 | 33 | 00110010 | 58 | 01001111 |
| 9 | 00010110 | 34 | 00110011 | 59 | 01010010 |
| 10 | 00010111 | 35 | 00110100 | 60 | 01010011 |
| 11 | 00011000 | 36 | 00110101 | 61 | 01010110 |
| 12 | 00011001 | 37 | 00110110 | 62 | 01010111 |
| 13 | 00011010 | 38 | 00110111 | 63 | 01011000 |
| 14 | 00011011 | 39 | 00111000 | 64 | 01011001 |
| 15 | 00011100 | 40 | 00111001 | 65 | 01011010 |
| 16 | 00011101 | 41 | 00111010 | 66 | 01011011 |
| 17 | 00011110 | 42 | 00111011 | 67 | 01011100 |
| 18 | 00011111 | 43 | 00111100 | 68 | 01011101 |
| 19 | 00100001 | 44 | 00111101 | 69 | 01011110 |
| 20 | 00100011 | 45 | 00111110 | 70 | 01011111 |
| 21 | 00100100 | 46 | 00111111 | 21 | 01100000 |
| 22 | 00100101 | 47 | 01000010 | 72 | 01100001 |
| 23 | 00100110 | 48 | 01000011 | 73 | 01100010 |
| 24 | 00100111 | 49 | 01000110 | 74 | 01100011 |
| 25 | 00101001 | 50 | 01000111 | 75 | 01100100 |

RECORDING AND REPRODUCING APPARATUS

BACKGROUND OF THE INVENTION

1) Field of the Invention

The present invention relates to a technology for recording and reproducing apparatuses, and more particularly, to a recording and reproducing apparatus that can be used for run-length-limited code at a high encoding rate satisfying a plurality of conditions of constraint regarding a string of successive zeros.

2) Description of the Related Art

Conventionally, a recording and reproducing apparatus having an encoder for encoding an information bit string to an encoded bit string and a decoder for decoding the encoded bit string to an information bit string has been widely used as a recording and reproducing apparatus for magnetic disks, optical disks, magneto-optical disks, etc. In such a recording and reproducing apparatus, for data recording, error correcting code (ECC) encoding is first performed and then run-length-limited (RLL) encoding is performed. For data reproduction, RLL decoding is first performed and then ECC decoding is performed. With such a configuration, errors tend to be propagated at the time of RLL decoding, and will exceed the limitation of error correction in ECC decoding. For example, Japanese Patent Laid-Open Publication No. 2003-68024 discloses a recording and reproducing apparatus of a conventional technology, in which, for data recording, ECC encoding is first performed and then RLL encoding is performed and, for data reproduction, RLL decoding is first performed and then ECC decoding is performed.

In a permutation scheme, the order of RLL encoding and ECC encoding and the order of RLL decoding and ECC decoding are each reversed. That is, error correction is performed with ECC decoding, and then RLL decoding is performed. Therefore, RLL code at a high encoding rate can be applied, thereby improving a signal-to-noise ratio. Also, in the permutation scheme, since RLL code at a high encoding rate is used, a replacement scheme with a small amount of calculation and a small circuit size is expected to be applied. A conventional technology regarding such a replacement scheme is disclosed in, for example, A. J. van Wijingaarden and K. A. Schouhamer Immink, "Construction of Constrained Codes employing Sequence Replacement Techniques", Proc. IEEE ISIT97, Ulm, Germany, pp. 144, Jun. 29, 1997.

However, in the conventional replacement scheme, although a G condition of constraint that limits a maximum number of bits of successive zeros (hereinafter, "0-run") is satisfied, an I condition of constraint that limits a maximum number of bits of 0-run for every two bits is not satisfied. Also, a process between code bit strings has such a problem as that the I condition of constraint is not satisfied, although the G condition of constraint is satisfied.

SUMMARY OF THE INVENTION

It is an object of the present invention to solve at least the above problems in the conventional technology.

A recording and reproducing apparatus according to one aspect of the present invention includes an encoder that encodes an information bit string, which is a plurality of successive bits indicating an information language, to a code bit string, which is a plurality of successive bits indicating a code language; and a decoder that decodes the code bit string to the information bit string. The encoder includes an encoding unit that encodes the information bit string to a code bit string that is a run-length-limited code satisfying a plurality of conditions of constraint regarding a string of successive zeros. The decoder includes a decoding unit that decodes the code bit string encoded by the encoding unit to the information bit string.

A recording and reproducing method according to another aspect of the present invention includes encoding an information bit string, which is a plurality of successive bits indicating an information language, to a code bit string, which is a plurality of successive bits indicating a code language; and decoding the code bit string to the information bit string. The encoding includes encoding the information bit string to a code bit string that is a run-length-limited code satisfying a plurality of conditions of constraint regarding a string of successive zeros. The decoding includes decoding the code bit string encoded by the encoding unit to the information bit string.

A computer program according to the present invention realizes the method according to the above aspect on a computer.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 14 is a table of an example of an address-code conversion for finding, from the number of "10" patterns in an information bit string shown in FIG. 5, an address code in a replacement process of the replacement-method encoder (1) before the interleave process;

FIG. 15 is a table of an example of an address-code conversion for finding, from the numbers of "10" patterns of information bit string shown in FIG. 5, an address code in the replacement process of the replacement-method encoder (2) after the interleave process;

DETAILED DESCRIPTION

Exemplary embodiments of a recording and reproducing apparatus according to the present invention are described in detail with reference to the accompanying drawings.

Figure 1:
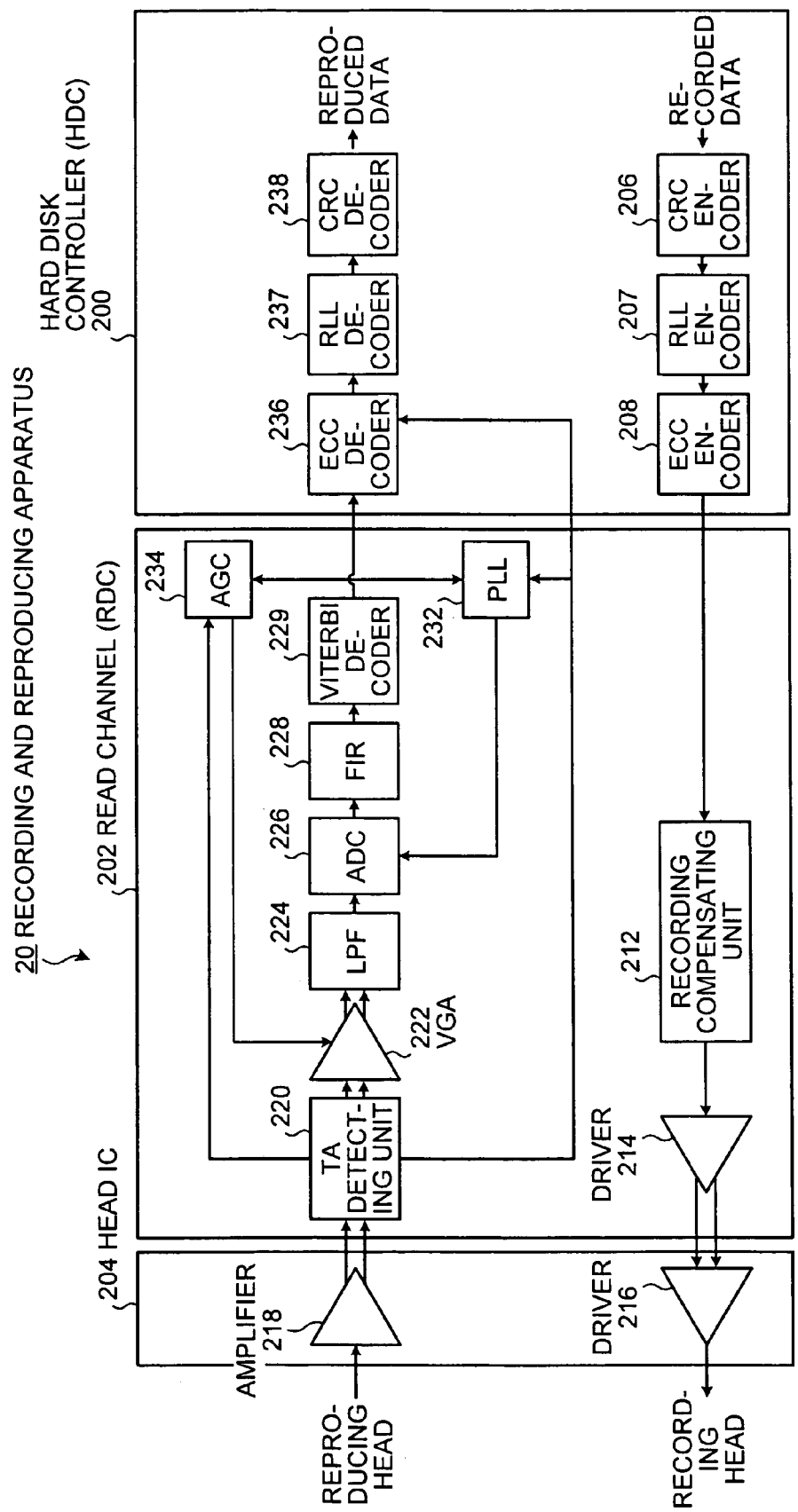
FIG. 1 is a block diagram of a recording and reproducing apparatus according to an embodiment of the present invention.

FIG. 1 is a block diagram of a recording and reproducing apparatus according to an embodiment of the present invention. A recording and reproducing apparatus 20 includes an RLL encoder 207 for encoding an information bit string, which is a plurality of successive bits indicative of an information language, to a code bit string, which is a plurality of successive bits indicative of a code language, and an RLL decoder 237 for decoding a code bit string to an information bit string, and has a feature that the apparatus can be used for RLL code at a high encoding rate satisfying a plurality of constraints regarding a 0-run.

The RLL encoder 207 encodes an information bit string to a code bit string, which is RLL code at a high encoding rate satisfying a plurality of constraints regarding 0-run. The RLL decoder 237 decodes the code bit string obtained through encoding by the RLL encoder 207 to an information bit string. With this, the apparatus can be used for RLL code at a high encoding rate satisfying a plurality of constraints regarding a 0-run.

The recording and reproducing apparatus 20 according to the present embodiment is a recording apparatus for magnetic disks, optical disks, magneto-optical (MO) disks, etc., and includes a hard disk controller (HDC) 200, a read channel (RDC) 202, and a head IC 204.

For data recording, the HDC 200 performs encoding via a cyclic redundancy check (CRC) encoder 206, the RLL encoder 207, and an ECC encoder 208. The CRC encoder 206 is used for error correction of ECC.

The RLL encoder 207 is an encoder at a high encoding rate for encoding an information bit string of n bits to a code bit string of (n+1) bits satisfying RLL conditions of constraint. An encoding rate is defied with a ratio between the number of bits in the information bit string and the number of bits in the code bit string. Therefore, the encoding rate of the RLL encoder 207 is n/(n+1). The high encoding rate means that the ratio is close to one. As the ratio is closer to one, the performance of the encoder is better.

The ECC encoder 208 is an encoder for error correction. The RDC 202 sends recording data to a driver 216 of the head IC 204 via a recording compensating unit 212 and a driver 214. The recording compensating unit 212 performs a compensating process for widening a reversal interval between flux reversals adjacent to each other. The driver 216 of the head IC 204 generates a write current onto a recording head.

For data reproduction, an amplifier 218 of the head IC 204 amplifies an analog voltage input from a reproducing head, and then sends to the RDC 202. In the RDC 202, after a detecting process of a thermal asperity (TA) detecting section 220, conversion to a digital signal is performed through a variable gain amplifier (VGA) 222, a low-pass filter (LPF) 224, and an analog-to-digital converter (ADC) 226. Also, in the RDC 202, after an FIR filter (FIR) 228 performs waveform equalization, a Viterbi decoder 229 performs Viterbi decoding for output to the HDC 200. Furthermore, the RDC 202 includes a PLL 232 which controls a timing of signal sampling and an automatic gain controller (AGC) 234 which controls a gain of the VGA 222.

In the HDC 200, after an ECC decoder 236 performs error correction on data input from the RDC 202, an RLL decoder 237 decodes an RLL code bit string at high encoding rate to an information bit string by following an encoding process of the RLL encoder 207 in reverse. Also, a CRC decoder 238 performs a check process for data reproduction.

General RLL conditions of constraint that have to be satisfied by the RLL encoder 207 shown in FIG. 1 are a G condition of constraint and an X condition of constraint. The G condition of constraint is a constraint that limits a maximum number of bits of successive zeros in an information bit string, while the X condition of constraint is a constraint that limits a maximum number of bits of successive zeros for each predetermined number of bits in an information bit string. Particularly, of such X conditions of constraint, a constraint that limits a maximum number of bits of successive zeros for every two bits in an information bit string is referred to as an I condition of constraint. The G condition of constraint suppresses propagation of data errors, thereby making synchronization easy at the time of data decoding. Also, the I condition of constraint suppresses propagation of data errors that cannot be suppressed by the G condition of constraint.

In the present embodiment, the RLL encoder 207 that applies in such a manner that the G condition of constraint and the I condition of constraint to an information bit string are satisfied between information bit strings is studied. In the present embodiment, the constraints satisfied by the RLL encoder 207 are further specifically represented as follows (0,*G/I,r/R,l/L*)=(0,10/10,5/5,5/5)

where G=10 condition of constraint represents that the maximum number of bits of successive zeros is ten bits, and I=10 condition of constraint represents that the maximum number of bits of successive zeros between an even-numbered bit and an odd-numbered bit is ten bits.

Here, the G condition of constraint and the I condition of constraint have to be satisfied not only in the relevant information bit string but also between the relevant information bit string and an information bit string at the left or right thereof. For this, the following conditions of constraint are applied to the bit string at the left or right end of the relevant information bit string.

r=5 right-end condition of constraint: represents that the maximum number of successive zeros at the right end is five bits.

l=5 left-end condition of constraint: represents that the maximum number of successive zeros at the left end is five bits.

R=5 right-end condition of constraint: represents that the maximum number of successive zeros at the right end between an even-numbered bit and an odd-numbered bit is five bits.

L=5 left-end condition of constraint: represents that the maximum number of successive zeros at the left end between an even-numbered bit and an odd-numbered bit is five bits.

That is, the right-end constraints r and R or the left-end constraints l and L of the relevant information bit string and the left-end constraints l and L of the information bit string at the right of the relevant information bit string or the right-end constraints r and R of the information bit string at the left thereof have a relationship as follows:

the right-end condition of constraint r of the relevant information bit string+the left-end condition of constraint l of the information bit string at the right≦G condition of constraint;

the left-end condition of constraint l of the relevant information bit string+the right-end condition of constraint r of the information bit string at the left≦G condition of constraint;

the right-end condition of constraint R of the relevant information bit string+the left-end condition of constraint L of the information bit string at the right≦I condition of constraint; and the left-end condition of constraint L of the relevant information bit string+the right-end condition of constraint R of the information bit string at the right≦I condition of constraint.

In the following, the r condition of constraint, the l condition of constraint, the R condition of constraint, and the L condition of constraint are applied as conditions of constraint for a right-end process and a left-end process.

Figure 2A:
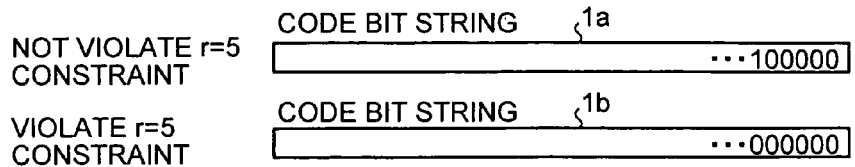
FIG. 2A is a schematic of an example of an r=5 condition of constraint satisfied by an RLL encoder shown in FIG. 1.
Figure 2B:
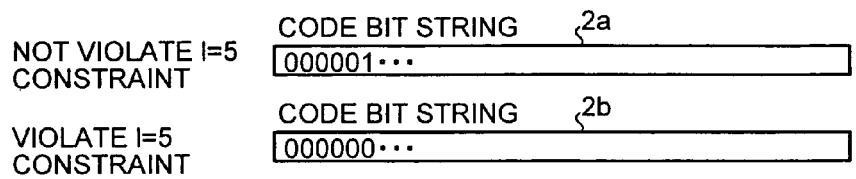
FIG. 2B is a schematic of an example of an l=5 condition of constraint satisfied by the RLL encoder shown in FIG. 1.
Figure 2C:
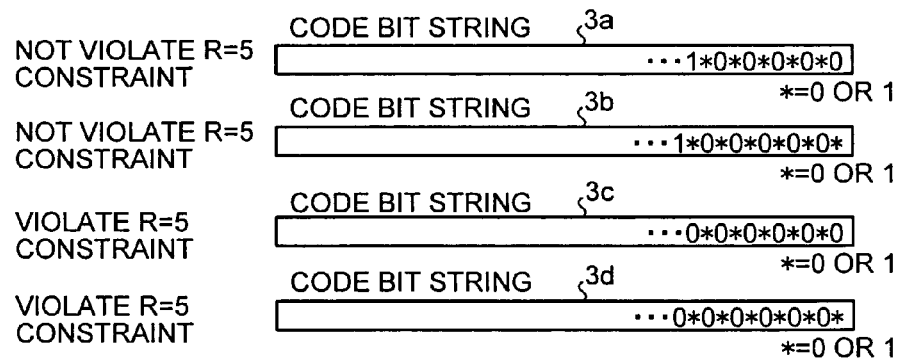
FIG. 2C is a schematic of an example of an R=5 condition of constraint satisfied by the RLL encoder shown in FIG. 1.
Figure 2D:
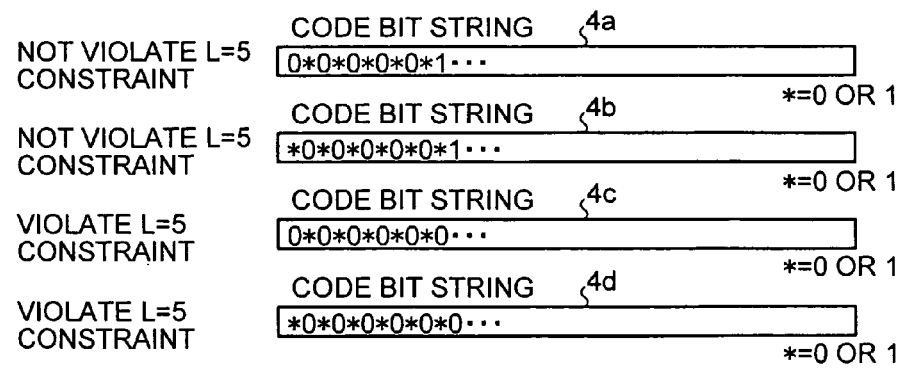
FIG. 2D is a schematic of an example of an L=5 condition of constraint satisfied by the RLL encoder shown in FIG. 1.

Here, with reference to FIGS. 2A to 2D, an example of the RLL condition of constraint satisfied by the RLL encoder 207 shown in FIG. 1 is described. FIG. 2A is a schematic of an example of an r=5 condition of constraint satisfied by an RLL encoder 207 shown in FIG. 1; FIG. 2B is a schematic of an example of an l=5 condition of constraint satisfied by the RLL encoder 207 shown in FIG. 1; FIG. 2C is a schematic of an example of an R=5 condition of constraint satisfied by the RLL encoder 207 shown in FIG. 1; and FIG. 2D is a schematic of an example of an L=5 condition of constraint satisfied by the RLL encoder 207 shown in FIG. 1.

As shown in FIG. 2A, a code bit string 1*a* is a bit string that does not violate the r=5 condition of constraint (does not have a possibility of violating the G condition of constraint), while a code bit string 1*b* is a bit string that violates the r=5 condition of constraint (has a possibility of violating the G condition of constraint). Also, as shown in FIG. 2B, a code bit string 2*a* is a bit string that does not violate the l=5 condition of constraint (does not have a possibility of violating the G condition of constraint), while a code bit string 2*b* is a bit string that violates the l=5 condition of constraint (has a possibility of violating the G condition of constraint).

Furthermore, as shown in FIG. 2C, code bit strings 3*a* and 3*b* are bit strings that do not violate the R=5 condition of constraint (do not have a possibility of violating the l condition of constraint), while code bit strings 3*c* and 3*d* are bit strings that violate the R=5 condition of constraint (have a possibility of violating the l condition of constraint). Still further, as shown in FIG. 2D, code bit strings 4*a* and 4*b* are bit strings that do not violate the L=5 condition of constraint (do not have a possibility of violating the l condition of constraint), while code bit strings 4*c* and 4*d* are bit strings that violate the L=5 condition of constraint (have a possibility of violating the l condition of constraint).

Figure 3:
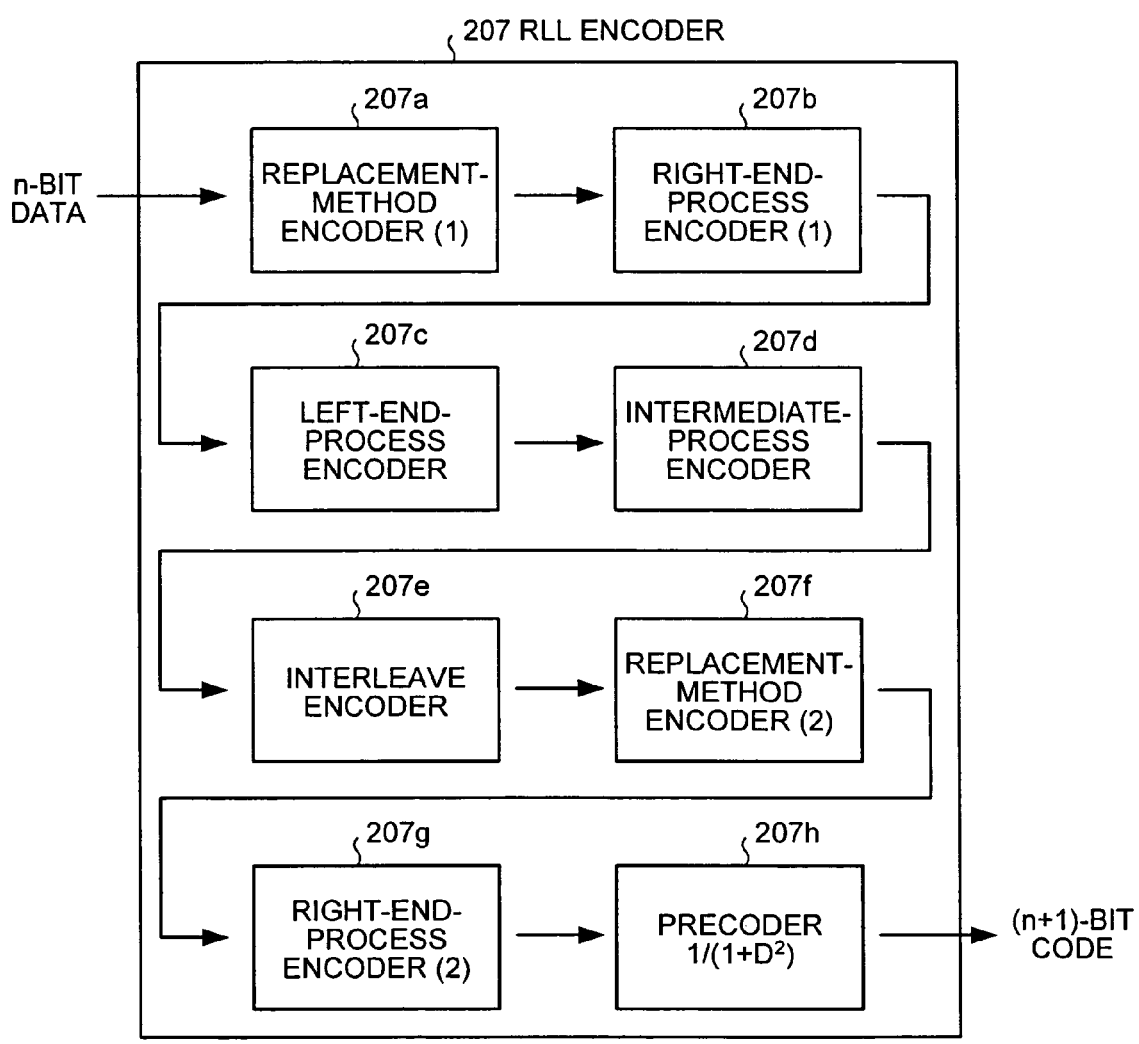
FIG. 3 is a block diagram of the RLL encoder shown in FIG. 1.

FIG. 3 is a block diagram of the RLL encoder 207 shown in FIG. 1. The RLL encoder 207 is an encoder at a high encoding rate for converting an information bit string of n=200 to a code bit string of (n+1)=201, including a replacement-method encoder (1) 207*a*, a right-end-process encoder (1) 207*b*, a left-end-process encoder 207*c*, an intermediate-process encoder 207*d*, an interleave encoder 207*e*, a replacement-method encoder (2) 207*f*, a right-end-process encoder (2) 207*g*, an a precoder 207*h*.

Figure 5:
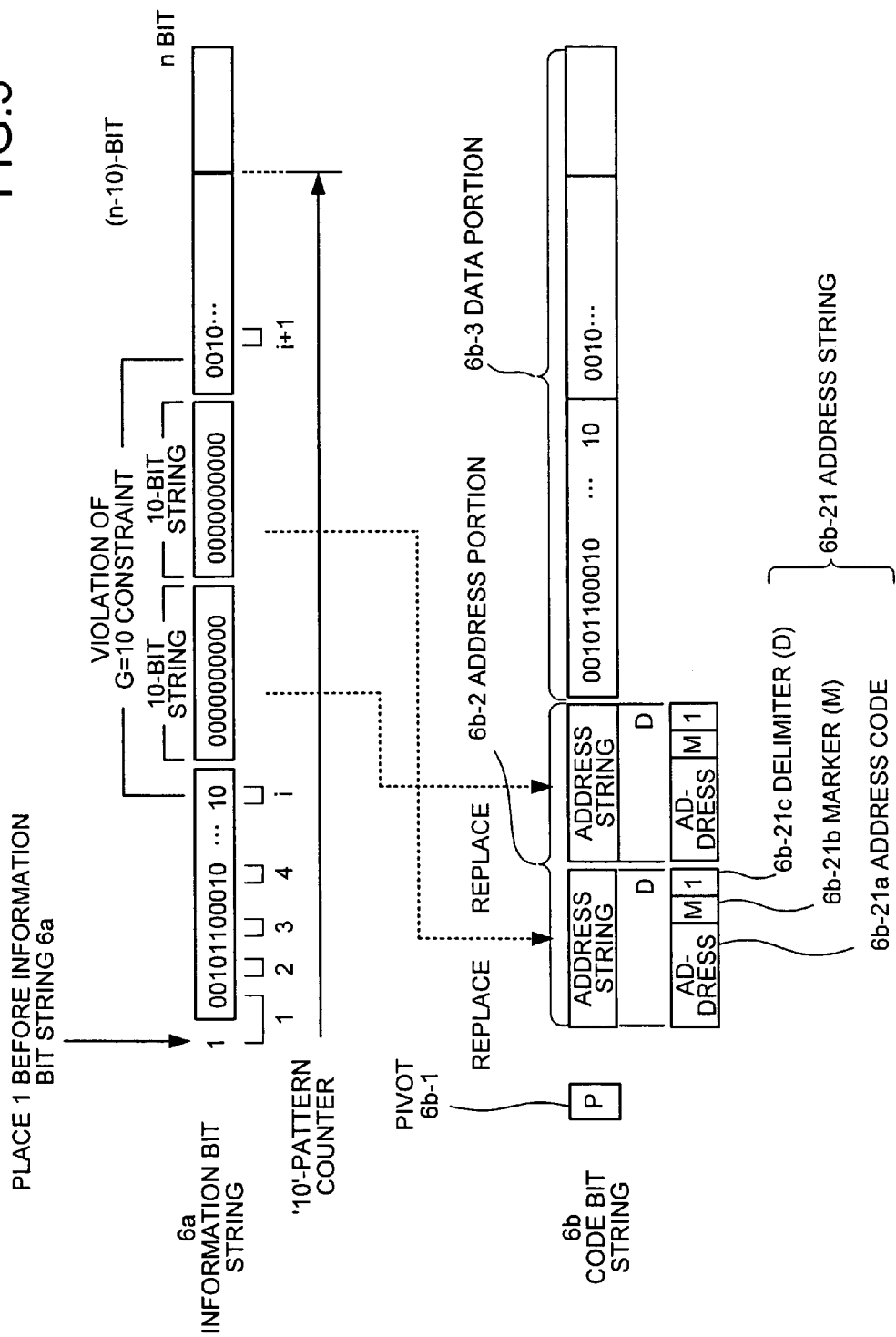
FIG. 5 is a schematic of an example in which a replacement-method encoder (1) shown in FIG. 3 converts an information bit string to a code bit string.

The replacement-method encoder (1) 207*a* is an encoder that extracts a bit string of ten bits from a bit string violating the G condition of constraint in an information bit string, and then performs a process of replacing the extracted bit string to an address string of ten bits. FIG. 5 is a schematic of an example in which a replacement-method encoder (1) 207*a* shown in FIG. 3 converts an information bit string to a code bit string An information bit string 6*a* has a bit string violating a G=10 condition of constraint, that is a bit string of zero exceeding ten bits. The replacement-method encoder (1) 207*a* places "1" before the information bit string 6*a*, and then counts the number of "10" patterns from the start with a "10"-pattern counter. Then, from the number of "10" patterns and an address-code conversion table, which will be separately described, an address code of eight bits is found and is taken as an address of the bit string violating the G=10 condition of constraint. Furthermore, as shown in FIG. 5, a bit string of ten bits is extracted from the bit string violating the G=10 condition of constraint, and then the extracted bit string of ten bits is replaced by an address string of ten bits. With such replacement, the replacement-method encoder (1) 207*a* can convert the information bit string 6*a* to a code bit string 6*b* satisfying the G=10 condition of constraint.

The code bit string 6*b* has a pivot 6*b*-1, an address portion 6*b*-2, and a data portion 6*b*-3. The pivot 6*b*-1 is data of one bit for identifying whether the code bit string 6b satisfies the RLL conditions of constraint, and is defined as follows:

P=1: represents that the input information bit string 6a satisfies all of the G, I, r, R, l, and L conditions of constraint; and P=0: represents that the input information bit string 6a does not satisfy any one or more of the G, I, r, R, l, and L conditions of constraint.

The address portion 6b-2 has a plurality of address strings obtained by replacing a bit string violating the G condition of constraint or the l condition of constraint. For example, an address string 6b-21 contains an address 6b-21a, a marker (M) 6b-21b, and a delimiter (D) 6b-21c. The address 6b-21a is an address code of eight bits found from the number of "10" patterns as described above and the address-code conversion table, which will be separately described.

The marker (M) 6b-21b is data of one bit, and is defined as follows:

M=1: represents that replacement of the bit string violating the G or I condition of constraint by an address string is performed before an interleave process; and M=0: represents that replacement of the bit string violating the G or I condition of constraint by an address string is performed after an interleave process.

The delimiter (D) 6b-21c is data of one bit, and is defined as follows:

D=1: represents that the delimiter 6b-21c is followed by a data portion 6b-3; and D=0: represents that the delimiter 6b-21c is followed by another address string.

Here, prior to description of the right-end-process encoder (1) 207b, with reference to FIGS. 14 and 15, an example of the address-code conversion table for finding an address code before and after the interleave process from the number of "10" patterns in the information bit string 6a shown in FIG. 5 is described. FIG. 14 is a table of an example of an address-code conversion for finding, from the number of "10" patterns in an information bit string shown in FIG. 5, an address code in a replacement process of the replacement-method encoder (1) 207a before the interleave process. FIG. 15 is a table of an example of an address-code conversion for finding, from the numbers of "10" patterns of information bit string shown in FIG. 5, an address code in the replacement process of the replacement-method encoder (2) 207f after the interleave process.

As shown in FIG. 14, the address-code conversion table 15 is a table associating the number "i" of "10" patterns in the information bit string 6a shown in FIG. 5 and an address code "F1(i)" before the interleave process with each other. From the address code, the following two bit strings having a possibility of violating the G=10 condition of constraint and the I=10 condition of constraint are excluded:

(a) 00000***; and
(b)*0*0*0*0.

Also as shown in FIG. 15, the address-code conversion table 16 is a table associating the number "i" of "10" patterns in the information bit string 6a shown in FIG. 5 and an address code "F2(i)" after the interleave process with each other. From the address code, the following three bit strings having a possibility of violating the G=10 condition of constraint and the I=10 condition of constraint are excluded:

(a) 00000***;
(b)*0*0*0*0; and
(c) 0*0*0*0*, where "*" represents a bit of zero or one.

As such, the replacement-method encoder (1) 207a and the replacement-method encoder (2) 207f generate an address string by using an address-code conversion table from which bit strings that have a possibility of violating the G condition of constraint and the I condition of constraint are excluded, and therefore can be used for RLL code at a high encoding rate satisfying the G condition of constraint and the I condition of constraint.

Figure 6:
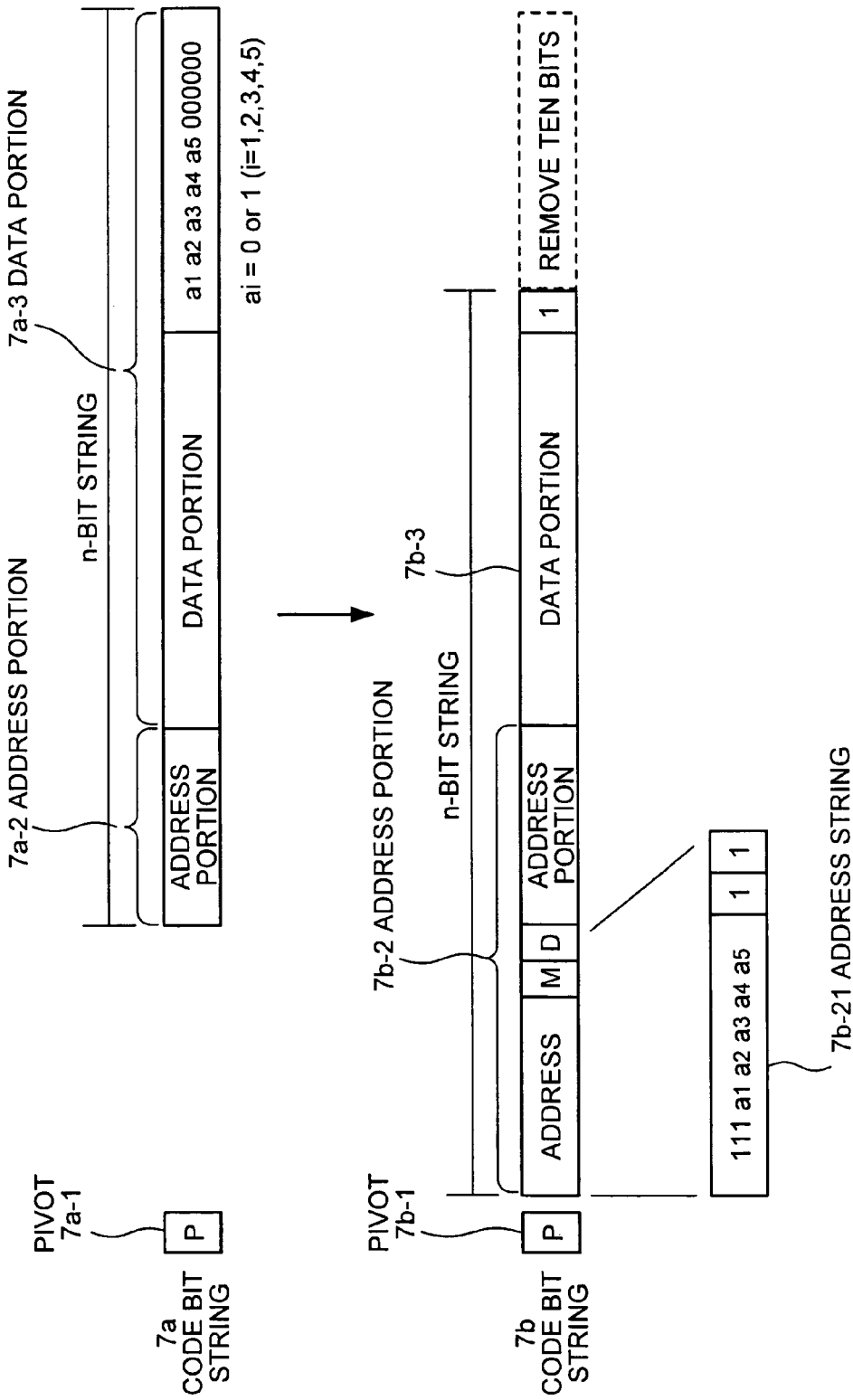
FIG. 6 is a schematic of an example in which a right-end process encoder (1) shown in FIG. 3 performs conversion into a data portion satisfying an I=10 condition of constraint between code bit strings.

Referring back to FIG. 3, the right-end-process encoder (1) 207b is an encoder that performs a right-end process of extracting a bit string of ten bits at the right end including the bit string of zero at the right end of the information bit string, and then replacing the extracted bit string by an address string of ten bits with a specific bit string in the extracted bit string being left. Here, with reference to FIG. 6, an example in which the replacement-method encoder (1) 207a shown in FIG. 3 performs conversion to a data portion 7b-3 satisfying the I=10 condition of constraint between code bit strings. FIG. 6 is a diagram of the example in which the right-end process encoder (1) 207b shown in FIG. 3 performs conversion to the data portion 7b-3 satisfying the I=10 condition of constraint between code bit strings.

As shown in the drawing, the code bit string 7a contains a bit string that has a possibility of violating the I=10 condition of constraint between the code bit string and a code bit string at the right thereof after an interleave process, that is, contains a bit string of zero exceeding five bits at the right end of the code bit string 7a. The right-end process encoder (1) 207b performs a right-end process of extracting a bit string of eleven bits at the right end of the code bit string 7a, and then replacing the extracted bit string by an address string 7b-21 using first five bits of the extracted eleven bits, and then adds a bit of one to the final bit of the code bit string 7b. With the right-end process being performed in such a manner as described above, the right-end process encoder (1) 207b can convert the data portion 7a-3 to a data portion 7b-3 satisfying the I=10 condition of constraint between the relevant code bit string and the code bit string at the right thereof.

Figure 7:
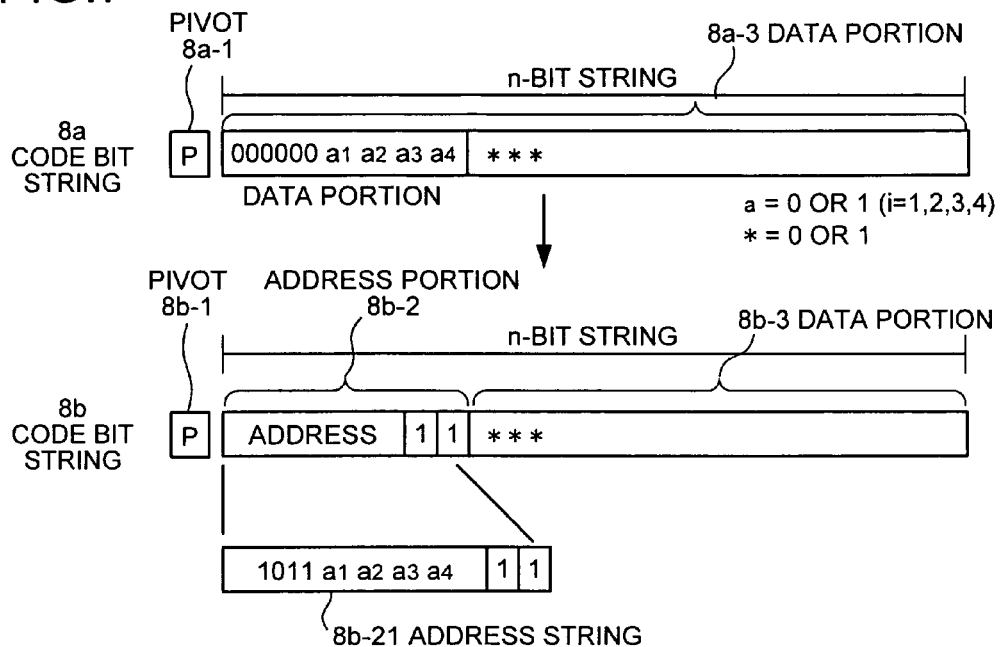
FIG. 7 is a schematic of an example in which a left-end-process encoder shown in FIG. 3 performs conversion into a data portion satisfying the I=10 condition of constraint between code bit strings.

Referring back to FIG. 3, the left-end-process encoder 207c is an encoder that performs a left-end process of extracting a bit string of ten bits including a bit string of zero at the left end of the information bit string, and then replacing the extracted bit string by an address string of ten bits with a specific bit string in the extracted bit string being left. Here, with reference to FIG. 7, an example in which the left-end-process encoder 207c shown in FIG. 3 performs conversion to a code bit string 8b satisfying the I=10 condition of constraint between code bit strings. FIG. 7 is a schematic of an example in which a left-end-process encoder 207c shown in FIG. 3 performs conversion into a data portion satisfying the I=10 condition of constraint between code bit strings.

The code bit string 8a contains a bit string that has a possibility of violating the I=10 condition of constraint between the code bit string and a code bit string at the left thereof after an interleave process, that is, contains a bit string of zero exceeding five bits at left end of the code bit string 8a. The left-end-process encoder 207c performs a left-end process of extracting a bit string of ten bits at the left end of the code bit string 8a, and then replacing the extracted bit string by an address string 8b-21 with latter four bits of the extracted ten bits being left. With the left-end process being performed in such a manner as described above, the left-end-process encoder 207c can convert the code bit string 8a-3 to the code bit string 8b satisfying the I=10 condition of constraint between the relevant code bit string and the code bit string at the left thereof.

Figure 8:
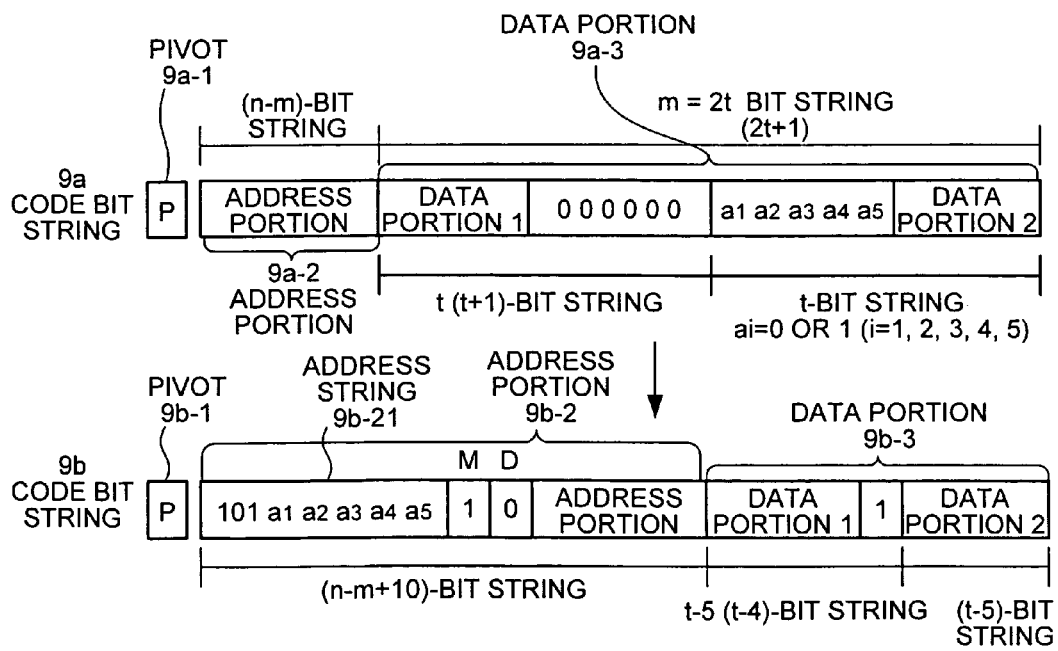
FIG. 8 is a schematic of an example in which an intermediate-process encoder shown in FIG. 3 performs conversion into a data portion satisfying the I=10 condition of constraint between code bit strings after an interleave process.

Referring back to FIG. 3, the intermediate-process encoder 207d is an encoder that extracts a bit string of ten bits including a bit string of zero at the left of the middle of the data string and then replaces the extracted bit string by an address string of ten bits with a specific bit string in the extracted bit string being left. FIG. 8 is a schematic of an example in which an intermediate-process encoder 207d shown in FIG. 3 performs conversion into a data portion satisfying the I=10 condition of constraint between code bit strings after an interleave process.

The code bit string 9a contains the data portion 9a-3 including a bit string that has a possibility of violating the I=10 condition of constraint after an interleave process, that is, a bit string of zero exceeding five bits at left end of the middle of the data portion 9a-3. The intermediate-process encoder 207d extracts a bit string of eleven bits at the middle of the code data portion 9a-3, replaces the extracted bit string by an address string 9b-21 with latter five bits of the extracted eleven bits being left, and then assigns a bit of one between a data portion 1 and a data portion 2 instead of the bit string of the extracted eleven bits. With the intermediate process being performed in such a manner as described above, the intermediate-process encoder 207d can convert the data portion 9a-3 to the data portion 9b-3 satisfying the I=10 condition of constraint between the relevant code bit string and the code bit string at the right thereof after the interleave process.

Figure 9:
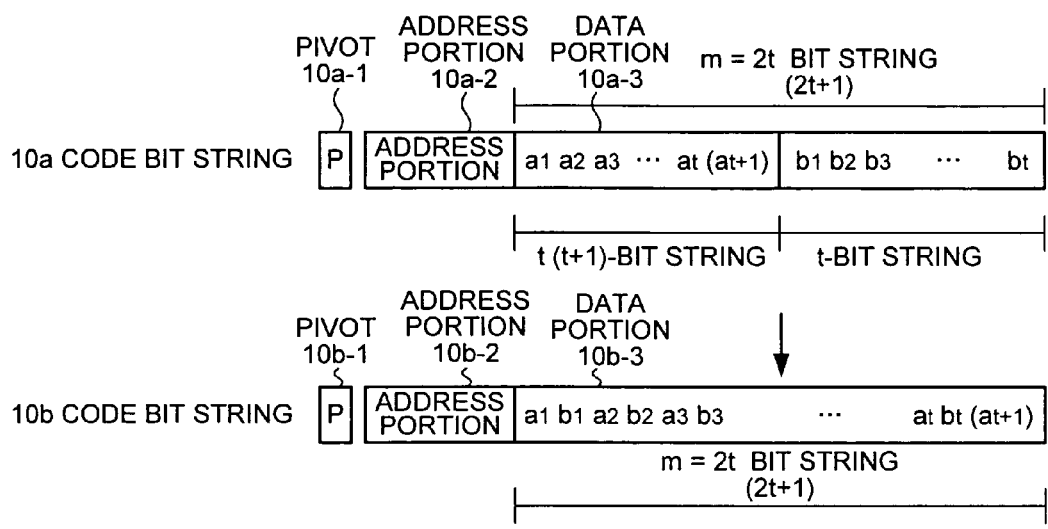
FIG. 9 is a schematic of an example in which an interleave encoder shown in FIG. 3 converts a data portion satisfying a G=10 condition of constraint to a data portion satisfying the I=10 condition of constraint.

Referring back to FIG. 3, the interleave encoder 207e is an encoder that performs an interleave process of dividing a data portion into a plurality of bit strings, sequentially extracting a bit one by one from these bit strings, and then sequentially arranging the extracted bits to generate a new bit string for replacement of the data portion. FIG. 9 is a schematic of an example in which an interleave encoder 207e shown in FIG. 3 converts a data portion satisfying a G=10 condition of constraint to a data portion satisfying the I=10 condition of constraint.

The interleave encoder 207e divides the data portion 10a-3 of a code bit string 10a into two bit strings at the middle. For example, when the data portion 10a-3 is an even-numbered bits of m=2t, the data portion is divided into two bit strings of t bits. when the data portion is an odd-numbered bits of m=(2t+1), the data portion is divided into, for example, a first-half bit string of (t+1) bits and a latter-half bit string of t bits. Then, an interleave process is performed in which bits are extracted alternately one by one from the head of the first-half bit string and the latter-half bit string for arrangement, thereby generating a new bit string of m=2t bits or m=(2t+1) bits, and then the data portion 10a-3 is replaced by the new bit string. With the interleave process being performed in such a manner as described above, the data portion 10a-3 satisfying the G=10 condition of constraint can be converted to the data portion 10b-3 satisfying the I=10 condition of constraint.

Referring back to FIG. 3, the replacement-method encoder (2) 207f is an encoder that extracts a bit string of ten bits from a bit string violating the G condition of constraint in a data portion and then replaces the extracted bit string by an address string of a bit string.

As shown in FIG. 5, the replacement-method encoder (2) 207f extracts a bit string of ten bits from a bit string violating the G condition of constraint in a code bit string, and then performs a process of replacing the extracted ten bits by an address string of ten bits. With the replacement process being performed in such a manner as described above, the replacement-method encoder (2) 207f can convert the data portion of the code bit string to a data portion satisfying the G=10 condition of constraint.

Figure 10:
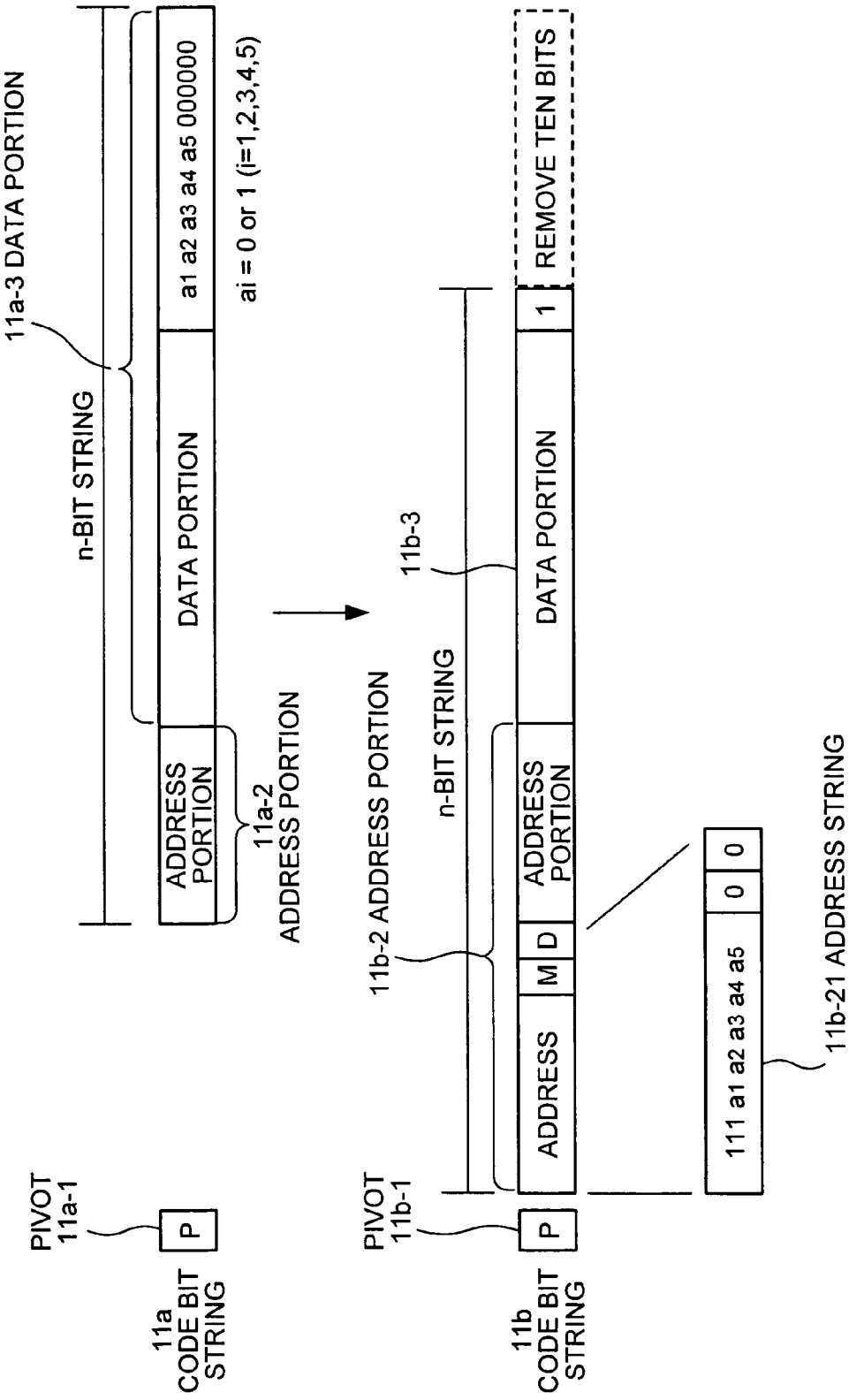
FIG. 10 is a schematic of an example in which a right end process encoder (2) shown in FIG. 3 performs conversion into a code bit string satisfying the G=10 condition of constraint between code bit strings.
Figure 11:
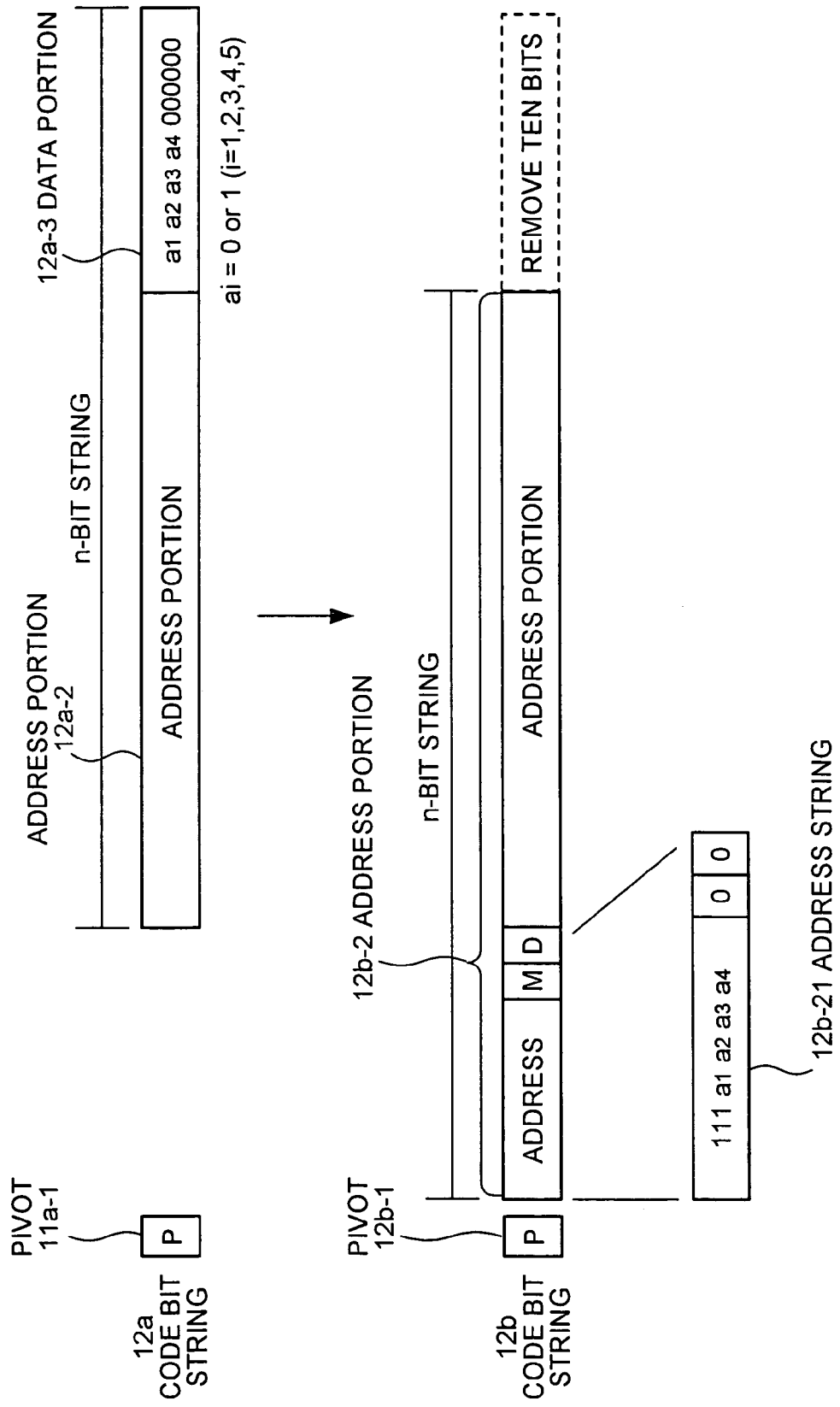
FIG. 11 is a schematic of an example in which the right-end process encoder (2) shown in FIG. 3 performs conversion into a code bit string satisfying the G=10 condition of constraint between code bit strings.

Referring back to FIG. 3, the right-end process encoder (2) 207g is an encoder that extracts a bit string of ten bits including a bit string of zero at the right end violating the r condition of constraint in a data portion, and then replaces the extracted bit string by an address string of ten bits with a specific bit string of the extracted bit string being left. FIG. 10 is a schematic of an example in which a right-end process encoder (2) 207g shown in FIG. 3 performs conversion into a code bit string satisfying the G=10 condition of constraint between code bit strings. FIG. 11 is a schematic of an example in which the right-end process encoder (2) 207g shown in FIG. 3 performs conversion into a code bit string satisfying the G=10 condition of constraint between code bit strings.

As shown in FIG. 10, when a data portion 11a-3 of the code bit string 11a is equal to or longer than eleven bits, the right-end process encoder (2) 207g performs a process in a manner similar to that of the right-end process encoder (1) 207b. On the other hand, as shown in FIG. 11, when a data portion 12a-3 of the code bit string 12a is ten bits, the right-end-process encoder (2) 207g performs a right-end process of extracting a bit string of ten bits at the right end of the code bit string 12a and then replacing the extracted bit string by an address string 12b-21 with first four bits of the extracted ten bits being left. With the right-end process being performed in such a manner as described above, the right-end process encoder (2) 207g can convert the code bit string 12a to a string satisfying the G=10 condition of constraint between the relevant code bit string and a code bit string at the right thereof.

FIGS. 12A to 12D are schematics of another examples of a right-end process of the right-end process encoder (2) 207g shown in FIG. 3. When the data portion is shorter than ten bits and violates the r=5 condition of constraint, the right-end-process encoder (2) 207g performs a right-end process of changing a value of the delimiter of the address string at the left of the data portion and replacing the data portion by a data portion with a specific bit string of the original data portion being left.

When the bit length of the information bit string is, for example, n=206 to 209 bits and the bit length of the address bit is ten bits, the data bit length of the data portion of the information bit string can be six to nine bits. Therefore, a phenomenon occurs in which, when extracting the bit string of ten bits as shown in FIGS. 10 and 11, the right-end process encoder (2) 207g has to also extract a part of the address portion. To avoid this, when the data portion is shorter than ten bits and violates the r=5 condition of constraint, the right-end process encoder (2) 207g performs the right-end process of changing the value of the delimiter of the address string at the left of the data portion and replacing the data portion by a data portion with a specific bit string of the original data portion being left.

Figure 12A:
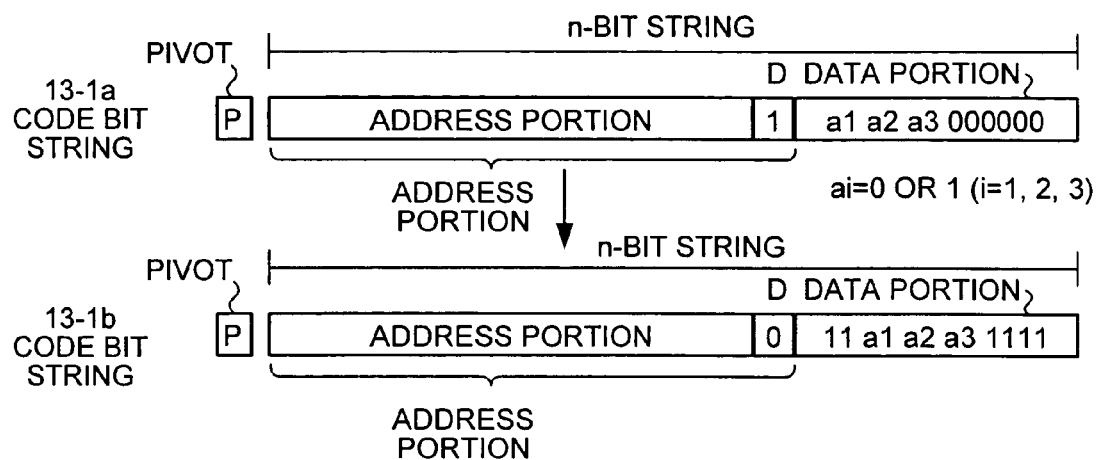
FIGS. 12A to 12D are schematics of another examples of a right-end process of the right-end process encoder (2) shown in FIG. 3.
Figure 12B:
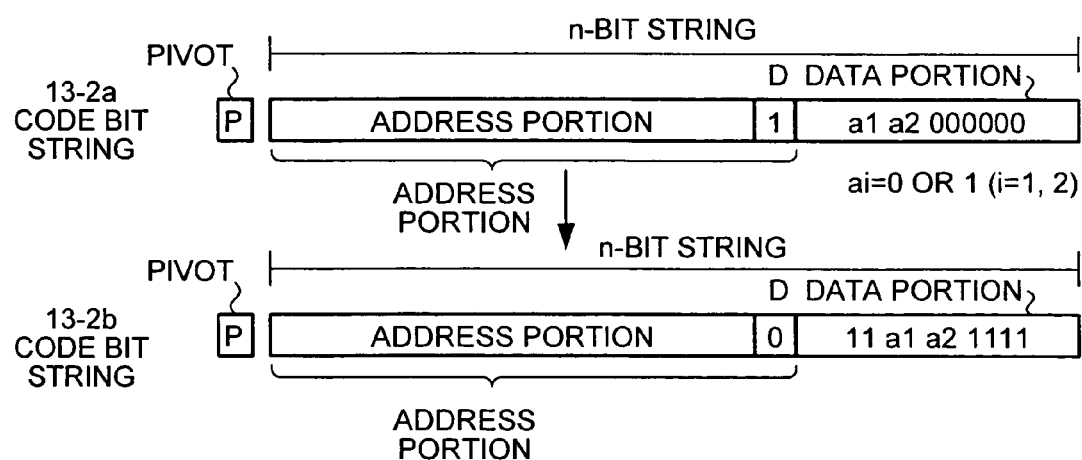
Figure 12C:
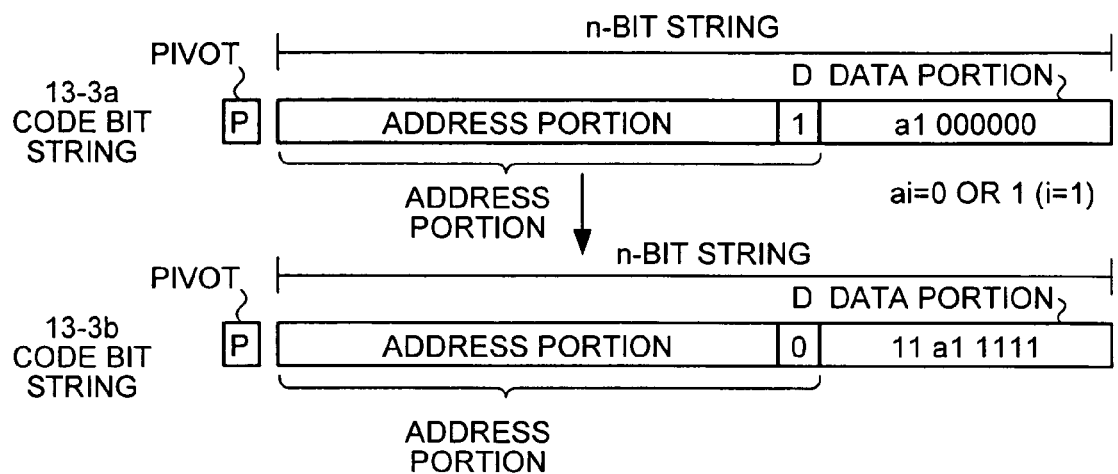
Figure 12D:
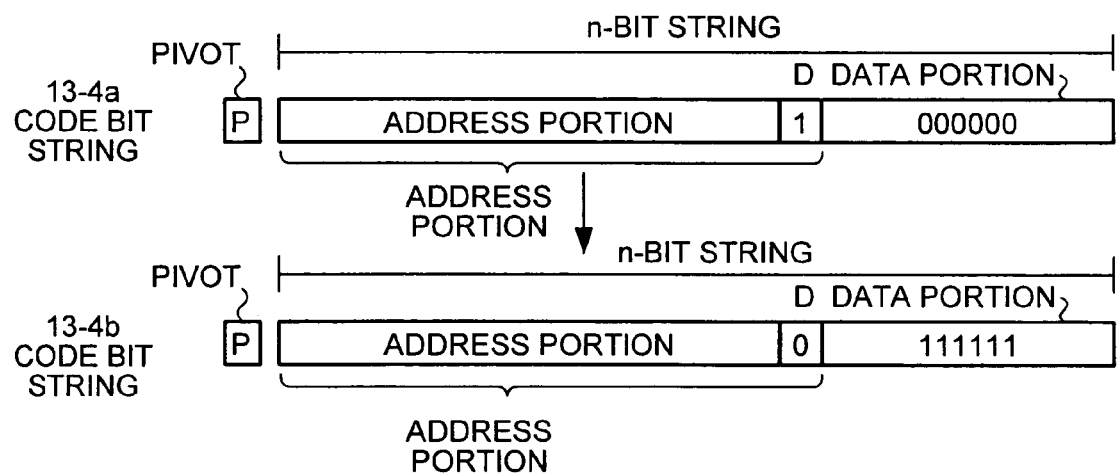
Figure 13B:
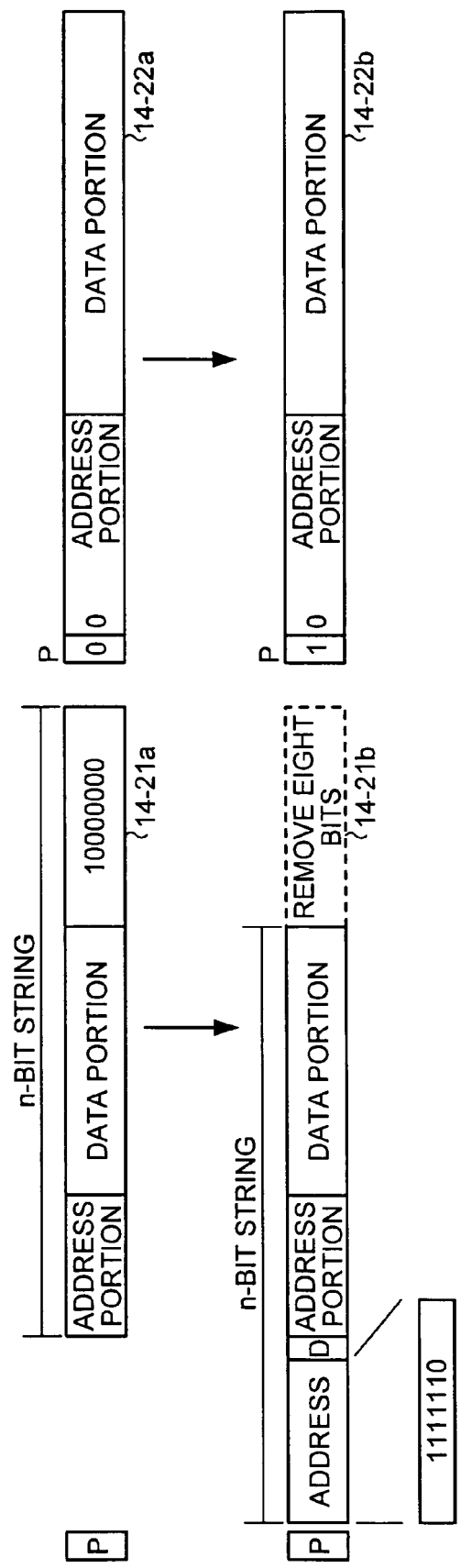
FIGS. 13A and 13H are schematics of still another examples of the right-end process of the right-end process encoder (2) shown in Fig 3.
Figure 13C:
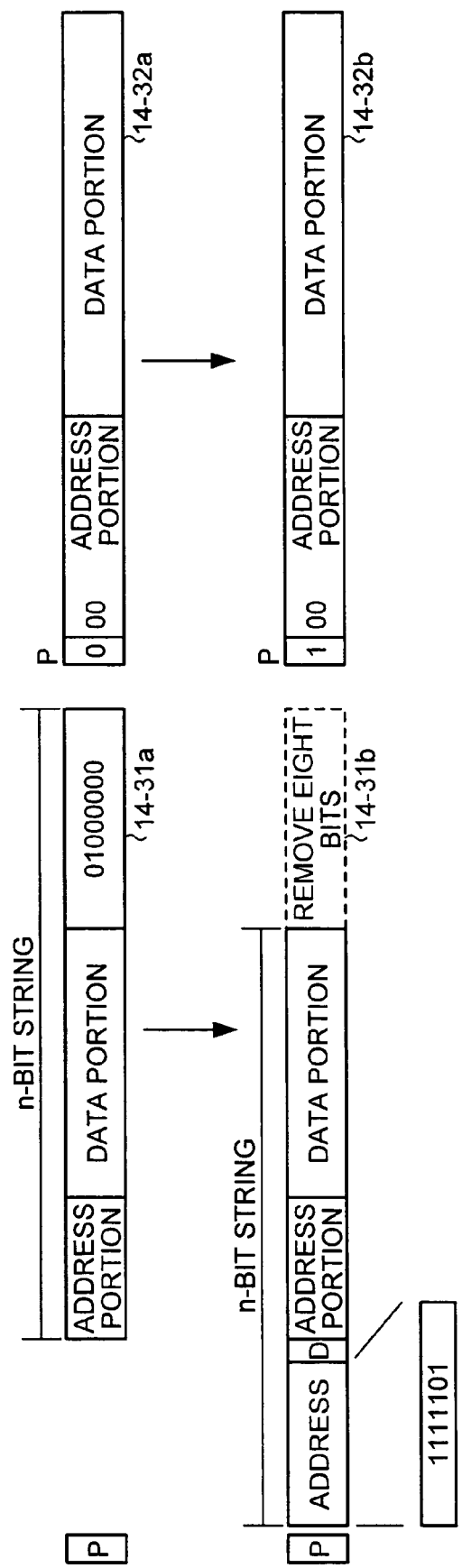
Figure 13F:
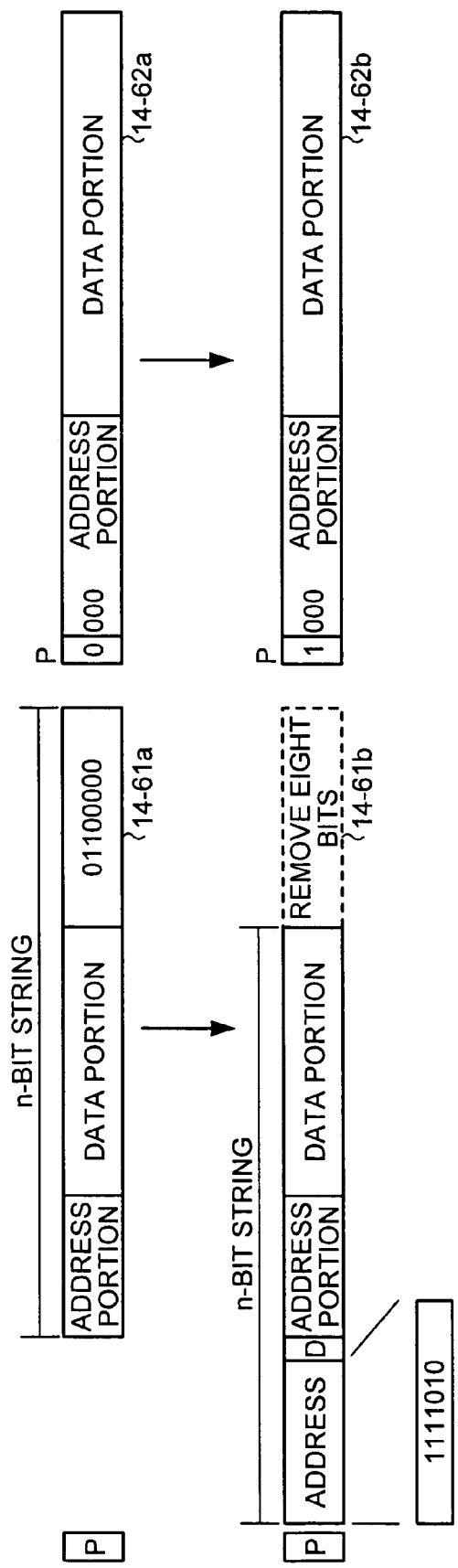
Figure 13G:
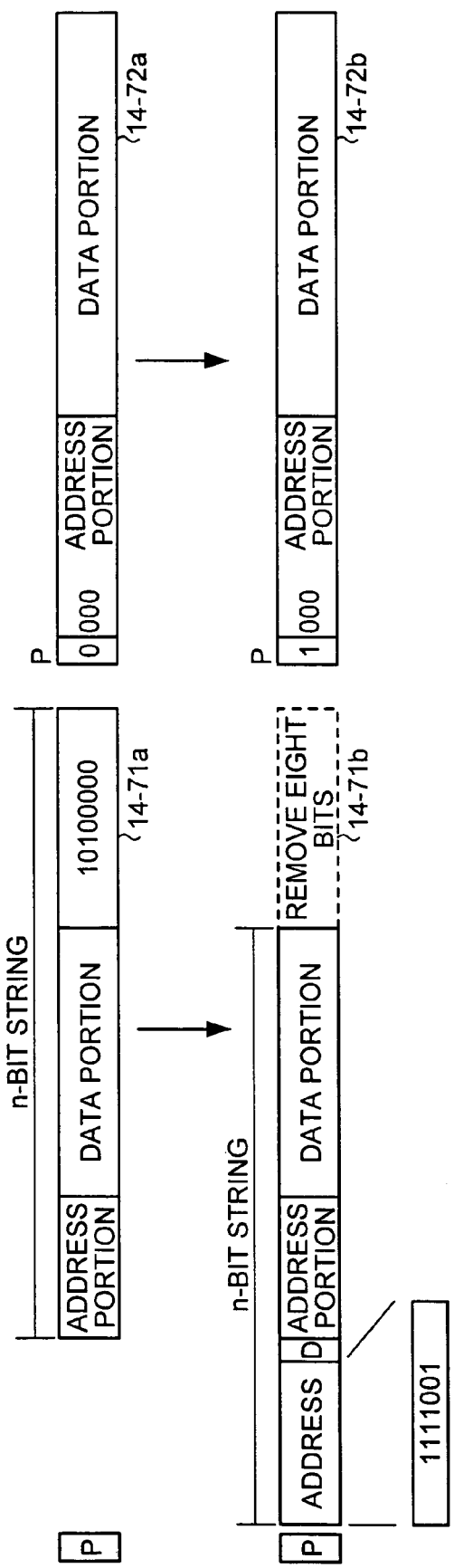
Figure 13H:
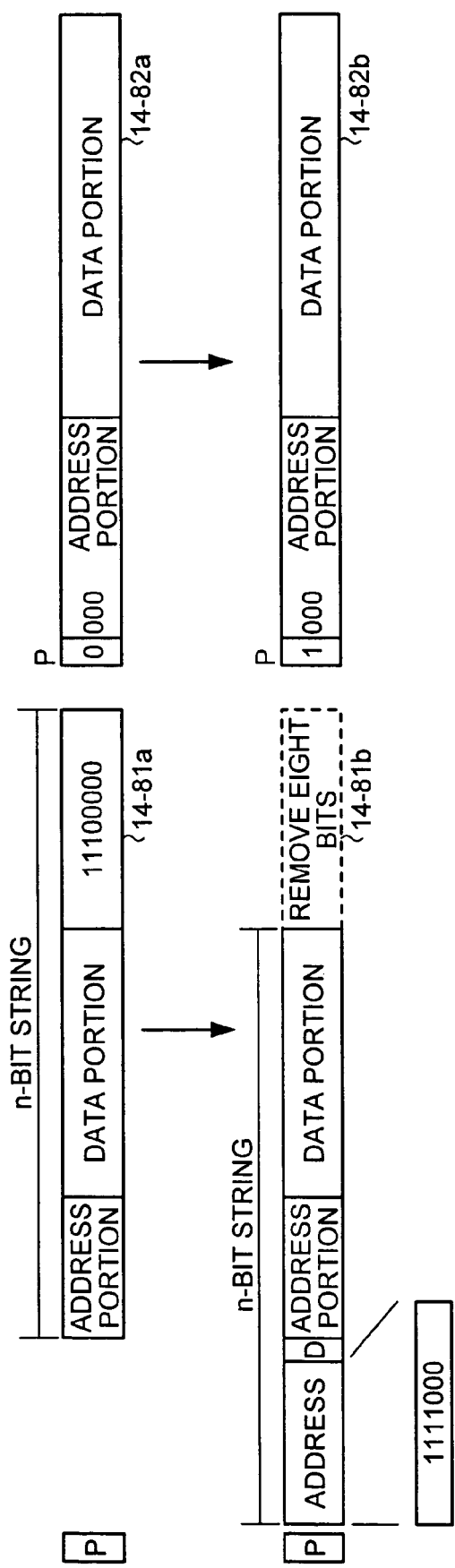

As shown in FIG. 12A, a code bit string 13-1a has a data portion of nine bits violating the r=5 condition of constraint. Therefore, the right-end process encoder (2) 207g performs a right-end process of changing the value of a delimiter at the left of the data portion to zero to generate a code bit string 13-1b and replacing the data portion by a data portion with a specific bit string of "a1a2a3" of the original data portion being left, that is, a data portion of "11a1a2a3111". This makes it possible to prevent a violation of the G=10 condition of constraint between code bit strings. Also, in FIGS. 12B, 12C, and 12D, the data portions of code bit strings 13-2a, 13-3a, and 13-4a are eight bits, seven bits, and six bits, respectively, violating the r=5 condition of constraint. Therefore, the right-end process encoder (2) 207g performs a right-end process in a manner similar to that shown in FIG. 12-A, thereby preventing a violation of the G=10 condition of constraint between code bit strings.

FIGS. 13A to 13H are schematics of still another example of the right-end process of the right-end process encoder (2) 207g shown in FIG. 3. In the example shown in FIGS. 13A to 13H, code bit strings satisfying the G=8 condition of constraint and the I=8 condition of constraint are handled. Similarly, code bit strings satisfying the G=10 condition of constraint and the I=10 condition of constraint can be handled.

When a bit string at the right end of a code bit string, a pivot of a code bit string at the right of the relevant code bit string, and a bit string at the left end of the right-end code bit string violate the G condition of constraint, the right-end process encoder (2) 207g replaces the right-end bit string by a specific address string, and reverses the value of the pivot of the code bit string at the right.

As shown in FIG. 13A, a code bit string 14-11a contains a bit string of zero of eight bits at the right end, and a pivot of a code bit string at the right of the code bit string 14-11a indicates zero. Therefore, there is a violation of the G condition of constraint between code bit strings. Therefore, the right-end process encoder (2) 207g converts the bit string of zero of eight bits at the right end of the cod bit string 14-11a by an address string having an address code of 127 in binary notation, that is, an address string of "11111111 D", and then reverses the pivot of a code bit string 14-12a to 1, thereby preventing a violation of the G=8 condition of constraint between code bit strings.

Similarly, in the example shown in FIGS. 13B to 13H, a right-end process is performed such that bit strings of zero of eight bits at the right ends of code bit strings 14-21a to 14-81a are replaced by address strings "1111110D", "1111101DD", "1111100D", "1111011D", "1111010D", "1111001D", and "1111000D" having address codes of 126, 125,124, 123, 122, 121, and 120, respectively. Furthermore, pivots of code bit strings 14-12a to 14-82a are reversed to one. With this, a violation of the G=8 condition of constraint between code bit strings can be prevented.

Referring back to FIG. 3, the precoder 207h is an encoder that converts the code bit string obtained through conversion by the replacement-method encoder (1) 207a to the right-end process encoder (2) 207g to an NRZ string.

Figure 4:
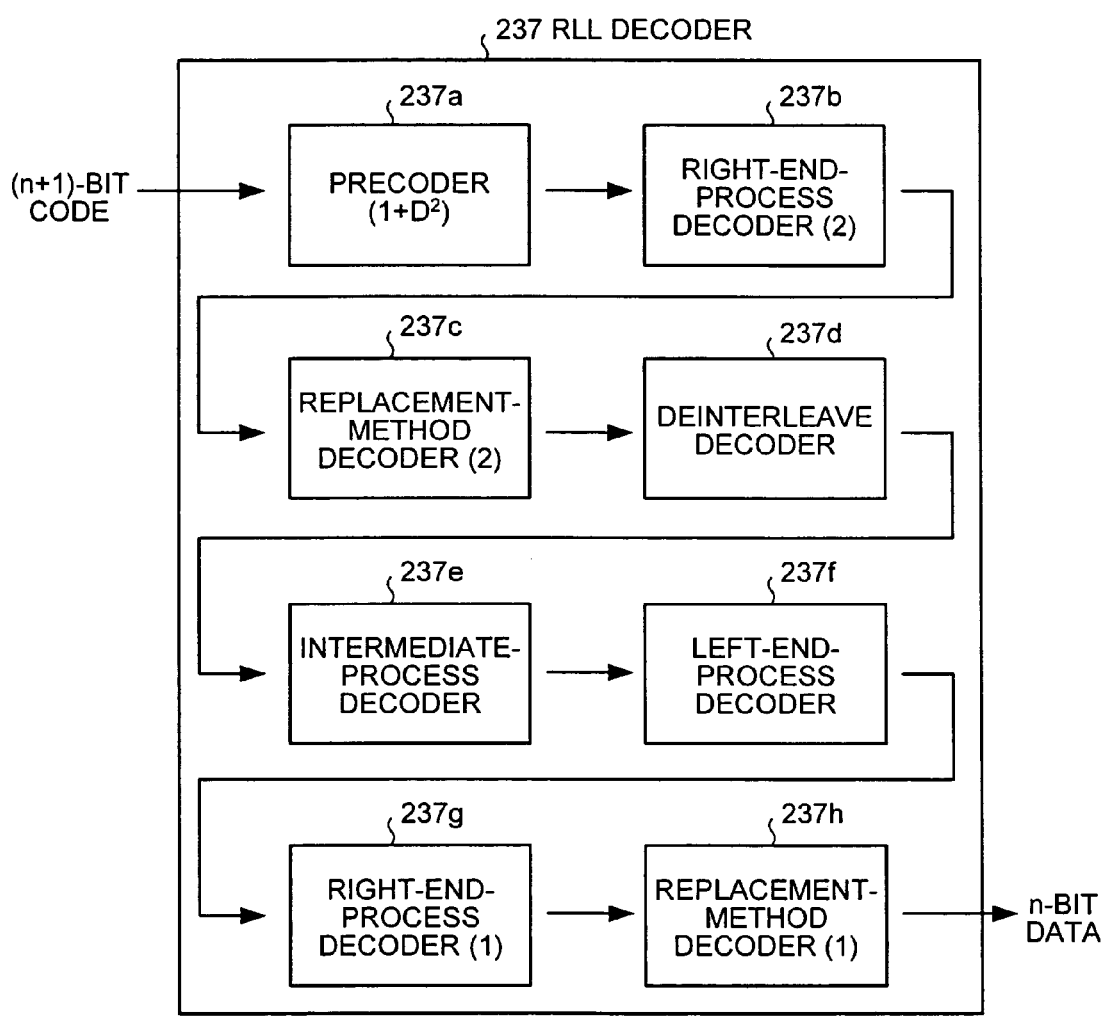
FIG. 4 is a block diagram of an RLL decoder shown in FIG. 1.

FIG. 4 is a block diagram of an RLL decoder 237 shown in FIG. 1. The RLL decoder 237 is a decoder at a high encoding rate, which converts a code bit string of n=201 satisfying the RLL condition of constraint to an information bit string of n=200, and includes a precoder 237a and a right-end-process decoder (2) 237b to a replacement-method decoder (1) 237h. The precoder 237a is a decoder which converts an NRZ string of n=201 satisfying the RLL condition of constraint to a code bit string. The right-end-process decoder (2) 237b to the replacement-method decoder (1) 237h are decoders which convert a code bit string of n=201 to an information bit string of n=200. A decoding process of the decoders is achieved by following the encoding process of the encoders in reverse, and therefore is not described herein.

Figure 16:
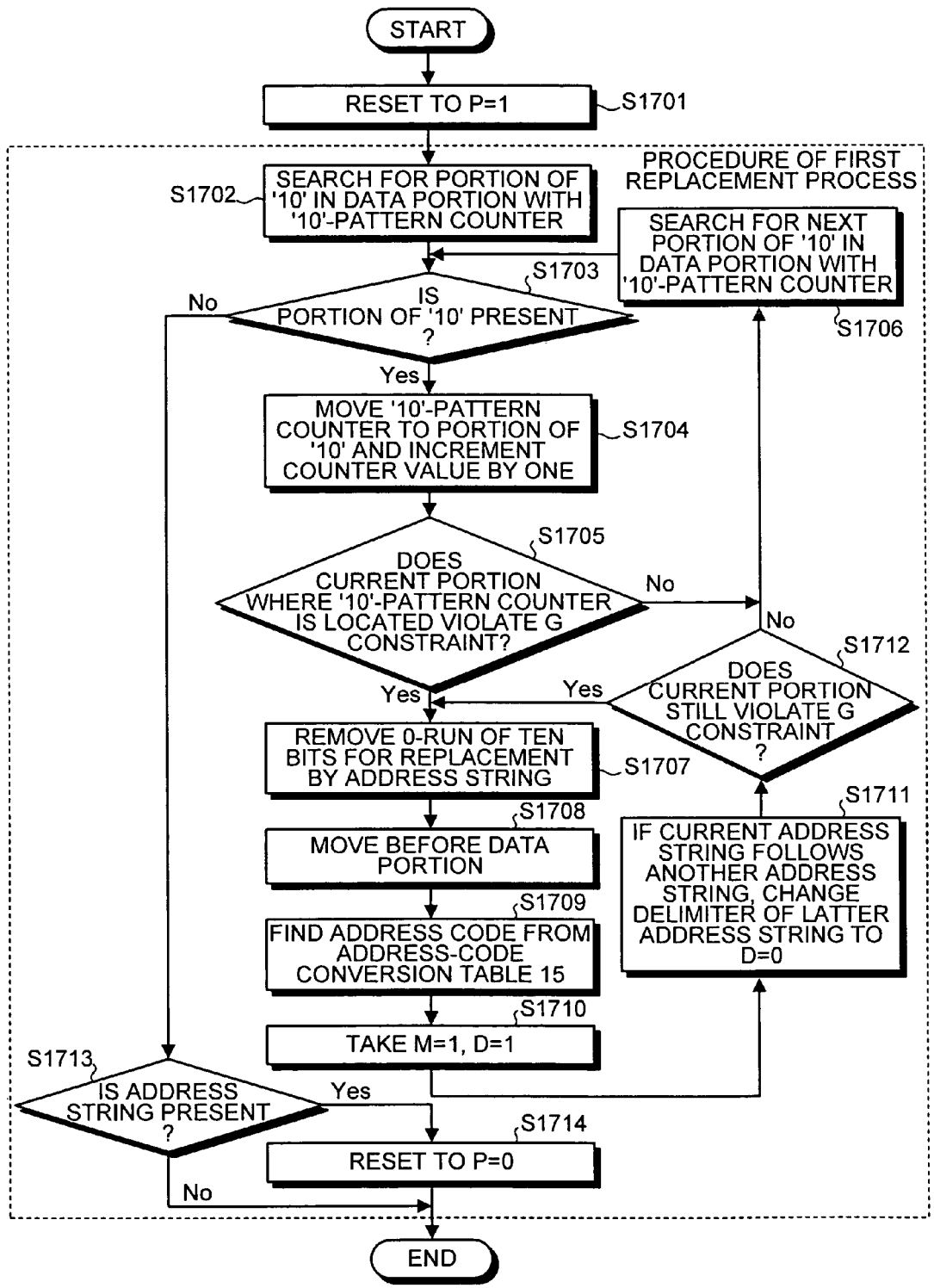
FIG. 16 is a flowchart of a process procedure for a first replacement process of the replacement-method encoder (1) shown in FIG. 3.

FIG. 16 is a flowchart of a process procedure for a first replacement process of the replacement-method encoder (1) 207a shown in FIG. 3. The replacement-method encoder (1) 207a places a pivot P at the head of the code bit string for reset to P=1 (step S1701), and then searches for a portion of "10" in the data portion with the "10"-pattern counter (step S1702). Then, the replacement-method encoder (1) 207a checks to see whether a portion of "10" is present (step S1703). As a result, if a portion of "10" is present ("YES" at step S1703), the replacement-method encoder (1) 207a moves the "10"-pattern counter to the portion of "10", and then increments the counter value by one (step S1704). Then, the replacement-method encoder (1) 207a checks to see whether the current portion where the "10"-pattern counter is located violates the G condition of constraint (step S1705). As a result, if the current portion where the "10"-pattern counter is located does not violate the G condition of constraint ("NO" at step S1705), the replacement-method encoder (1) 207a searches for a next portion of "10" in the data portion with the "10"-pattern counter (step S1706).

If the current portion where the "10"-pattern counter is located violates the G condition of constraint ("YES" at step S1705), the replacement-method encoder (1) 207a removes 0-run of ten bits for replacement by an address string (step S1707), and moves before the data portion (step S1708). Then, the replacement-method encoder (1) 207a finds an address code from the address-code conversion table (step S1709), and then takes the marker M=1 and the delimiter D=1 (step S1710). Furthermore, if the current address string follows another address string, the replacement-method encoder (1) 207a changes the delimiter of the latter address string to D=0 (stepS1711).

Then, the replacement-method encoder (1) 207a checks to see whether the current portion still violates the G condition of constraint (step S1712). As a result, if the current portion still violates the G condition of constraint ("YES" at step S1712), the replacement-method encoder (1) 207a returns to step S1707 for repeating the procedure of steps S1707 to S1711. If the current portion no longer violates the G condition of constraint ("NO" at step S1712), the procedure returns to step S1706.

If a portion of "10" is not present ("NO" at step S1703), the replacement-method encoder (1) 207a further checks to see whether an address string is present in the code bit string (step S1713). As a result, if an address string is present in the code bit string ("YES" at step S1713), the replacement-method encoder (1) 207a resets the pivot to P=0 (step S1714). If an address string is not present in the code bit string ("NO" at step S1713), the replacement-method encoder (1) 207a ends the procedure. In this manner, according to the present procedure, the replacement-method encoder (1) 207a can replace an information bit string to a code bit string satisfying the G condition of constraint.

Figure 17:
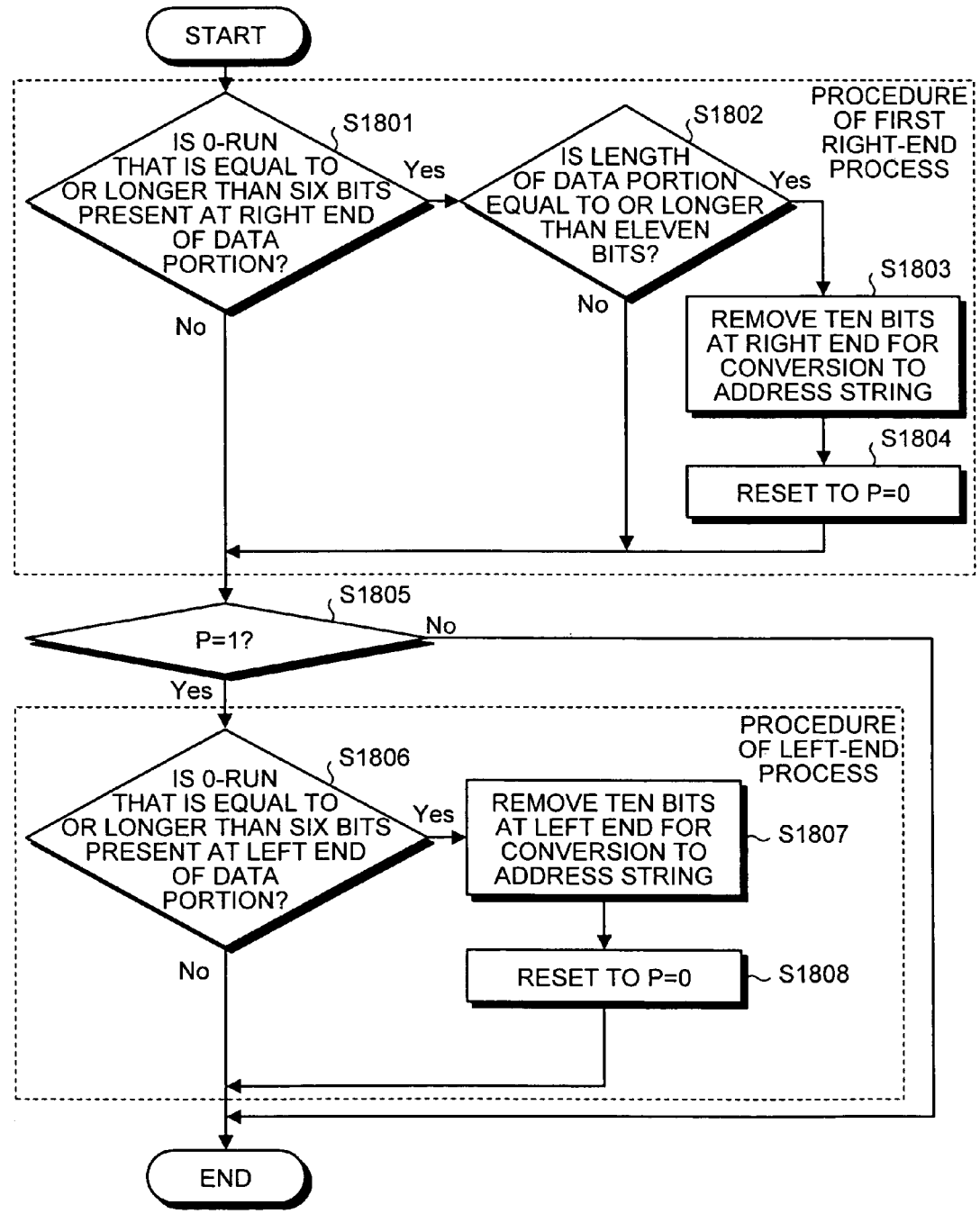
FIG. 17 is a flowchart of a process procedure for a first right-end process and a left-end process of the right-end process encoder (1) and the left-end-process encoder shown in FIG. 3, respectively.

FIG. 17 is a flowchart of a process procedure for a first right-end process and a left-end process of the right-end process encoder (1) 207b and the left-end-process encoder 207c shown in FIG. 3, respectively. The right-end-process encoder (1) 207b checks to see whether a 0-run that is equal to or longer than six bits is present at the right end of the data portion of the code bit string (step S1801). As a result, if a 0-run that is equal to or longer than six bits is not present at the right end of the data portion of the code bit string ("NO" at step S1801), the right-end-process encoder (1) 207b goes to the next process.

If a 0-run that is equal to or longer than six bits is present at the right end of the data portion of the code bit string ("YES" at step S1801), the right-end process encoder (1) 207b further checks to see whether the length of the data portion of the code bit string is equal to or longer than eleven bits (step S1802). As a result, if the length of the data portion of the code bit string is shorter than eleven bits ("NO" at step S1802), the right-end-process encoder (1) 207b goes to the next process.

If the length of the data portion of the code bit string is equal to or longer than eleven bits ("YES" at step S1802), the right-end process encoder (1) 207b removes ten bits at the right end for conversion to an address string (step S1803). Then, the first right-end process encoder 207b resets the pivot to P=0 (step S1804). Furthermore, the left-end-process encoder 207c checks to see whether the pivot of the code bit string is P=1 (step S1805). As a result, if the pivot of the code bit string is not P=1 ("NO" at step S1805), the left-end-process encoder 207c does not perform the left-end process.

If the pivot of the code bit string is P=1 ("YES" at step S1805), the left-end-process encoder 207c further checks to see a 0-run that is equal to or longer than six bits is present at the left end of the data portion of the code bit string (step S1806). As a result, if a 0-run that is equal to or longer than six bits is not present at the left end of the data portion of the code bit string ("NO" at step S1806), the left-end-process encoder 207c ends the procedure.

If a 0-run that is equal to or longer than six bits is present at the left end of the data portion of the code bit string ("YES" at step S1806), the left-end-process encoder 207c removes ten bits at the left end of the code bit string for conversion to an address string (step S1807). Then, the left-end-process encoder 207c resets the pivot of the code bit string as P=0 (step S1808), and then ends the procedure. In this manner, the right-end-process encoder (1) 207b and the left-end-process encoder 207c can perform replacement by a code bit string and a code bit string satisfying the I condition of constraint between code bit strings after the interleave process.

Figure 18:
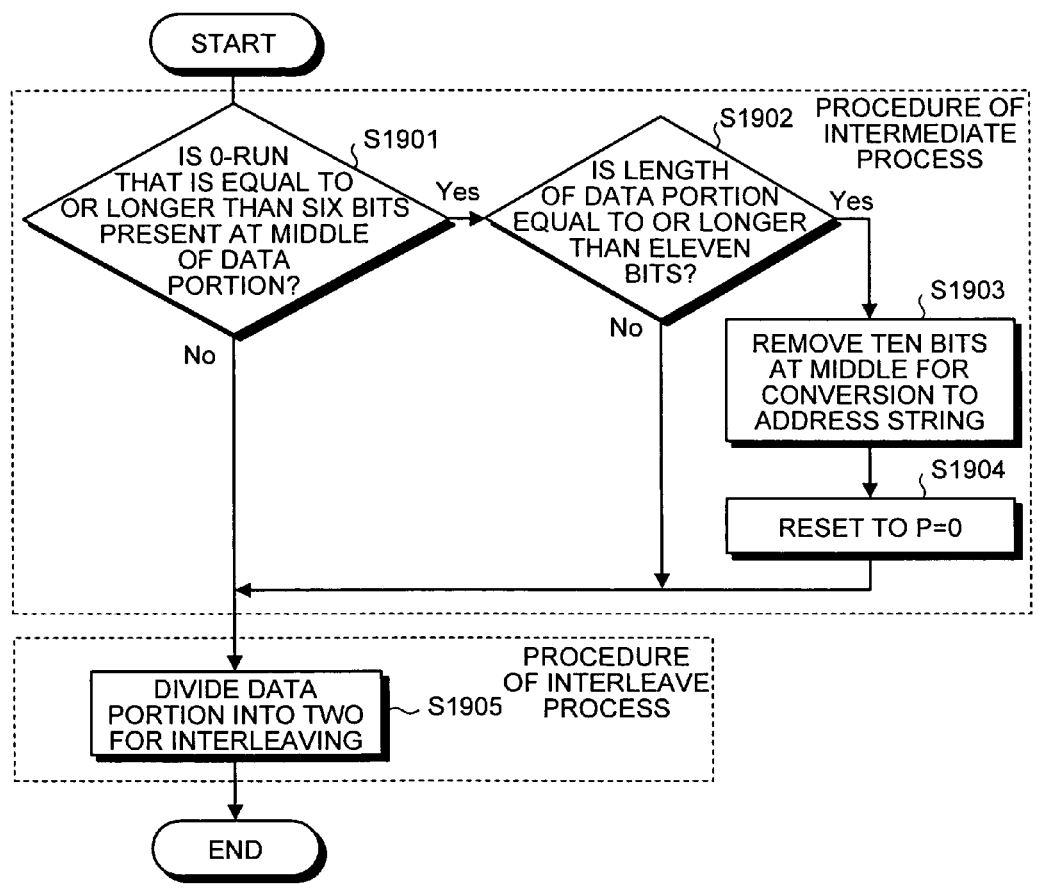
FIG. 18 is a flowchart of a process procedure for an intermediate process and an interleave process of the intermediate-process encoder and the interleave encoder shown in FIG. 3, respectively.

FIG. 18 is a flowchart of a process procedure for an intermediate process and an interleave process of the intermediate-process encoder 207d and the interleave encoder 207e shown in FIG. 3, respectively. The intermediate-process encoder 207d checks to see whether a 0-run that is equal to or longer than six bits is present at the middle of the data portion of the code bit string (step S1901). As a result, if a 0-run that is equal to or longer than six bits is not present at the middle of the data portion of the code bit string ("NO" at step S1901), the intermediate-process encoder 207d goes to the procedure of the interleave process.

If a 0-run that is equal to or longer than six bits is present at the middle of the data portion of the code bit string ("YES" at step S1901), the intermediate-process encoder 207d further checks to see whether the length of the data portion of the code bit string is equal to or longer than eleven bits (step S1902). As a result, if the length of the data portion of the code bit string is shorter than eleven bits ("NO" at step S1902), the intermediate-process encoder 207d goes to the procedure of the interleave process.

If the length of the data portion of the code bit string is equal to or longer than eleven bits ("YES" at step S1902), the intermediate-process encoder 207d removes ten bits at the middle of the data portion for conversion to an address string (step S1903). Then, the intermediate-process encoder 207d resets the pivot to P=0 (step S1904). Furthermore, the interleave encoder 207e divides the data portion of the code bit string into two for interleaving (step S1905). In this manner, according to this procedure, the intermediate-process encoder 207d and the interleave encoder 207e can convert a code bit string satisfying the G condition of constraint to a code bit string satisfying the I condition of constraint.

Figure 19:
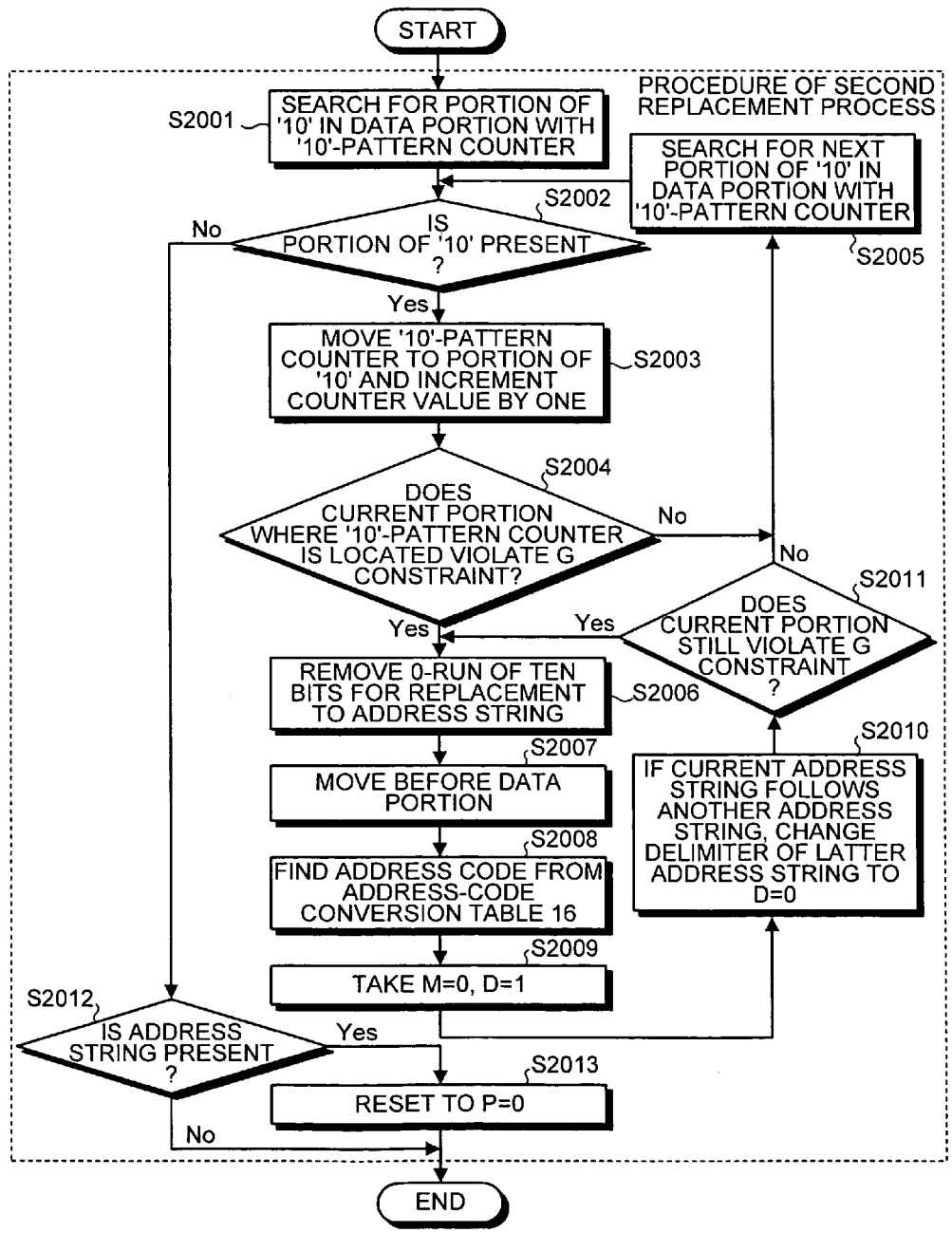
FIG. 19 is a flowchart of a process procedure for a second replacement process of the replacement-method encoder (2) shown in FIG. 3.

FIG. 19 is a flowchart of a process procedure for a second replacement process of the replacement-method encoder (2) 207f shown in FIG. 3. The replacement-method encoder (2) 207f searches for a portion of "10" in the data portion with the "10"-pattern counter (step S2001). Then, it is checked to see whether a portion of "10" is present (step S2002). As a result, if a portion of "10" is present ("YES" at step S2002), the replacement-method encoder (2) 207f moves the "10"-pattern counter to the portion of "10", and then increments the counter value by one (step S2003). Then, the replacement-method encoder (2) 207f checks to see whether the current portion where the "10"-pattern counter is located violates the G condition of constraint (step S2004). As a result, if the current portion where the "10"-pattern counter is located does not violate the G condition of constraint ("NO" at step S2004), the replacement-method encoder (2) 207f searches for a next portion of "10" in the data portion with the "10"-counter (step S2005).

If the current portion where the "10"-pattern counter is located violates the G condition of constraint ("YES" at step S2004), the replacement-method encoder (2) 207f removes a 0-run of ten bits for replacement to an address string (step S2006), and then moves before the data portion (step S2007). Then, the replacement-method encoder (2) 207f finds an address code from the address-code conversion table 16 (step S2008), and takes the marker M=0 and the delimiter D=1 (step S2009). Furthermore, if the current address string follows another address string, the replacement-method encoder (2) 207f changes the delimiter of the latter address string to D=0 (step S2010).

Then, the replacement-method encoder (2) 207f checks to see whether the current portion still violates the G condition of constraint (step S2011). As a result, if the current portion still violates the G condition of constraint ("YES" at step S2011), the replacement-method encoder (2) 207f returns to step S2006 for repeating the procedure of steps S2006 to S2010. If the current portion no longer violates the G condition of constraint ("NO" at step S2011), the procedure returns to step S2005.

If a portion of "10" is not present ("NO" at step S2002), the replacement-method encoder (2) 207f further checks to see whether an address string is present in the code bit string (step S2012). As a result, if an address string is present in the code bit string ("YES" at step S2012), the replacement-method encoder (2) 207f resets the pivot as P=0 (step S2013). If an address string is not present in the code bit string ("NO" at step S2012), the replacement-method encoder (2) 207f ends the procedure. In this manner, according to the present procedure, the if a portion of "10" is present ("YES" at step S2002), the replacement-method encoder (2) 207f can replace a code bit string satisfying the I condition of constraint by a code bit string satisfying the I condition of constraint and the G condition of constraint.

Figure 20:
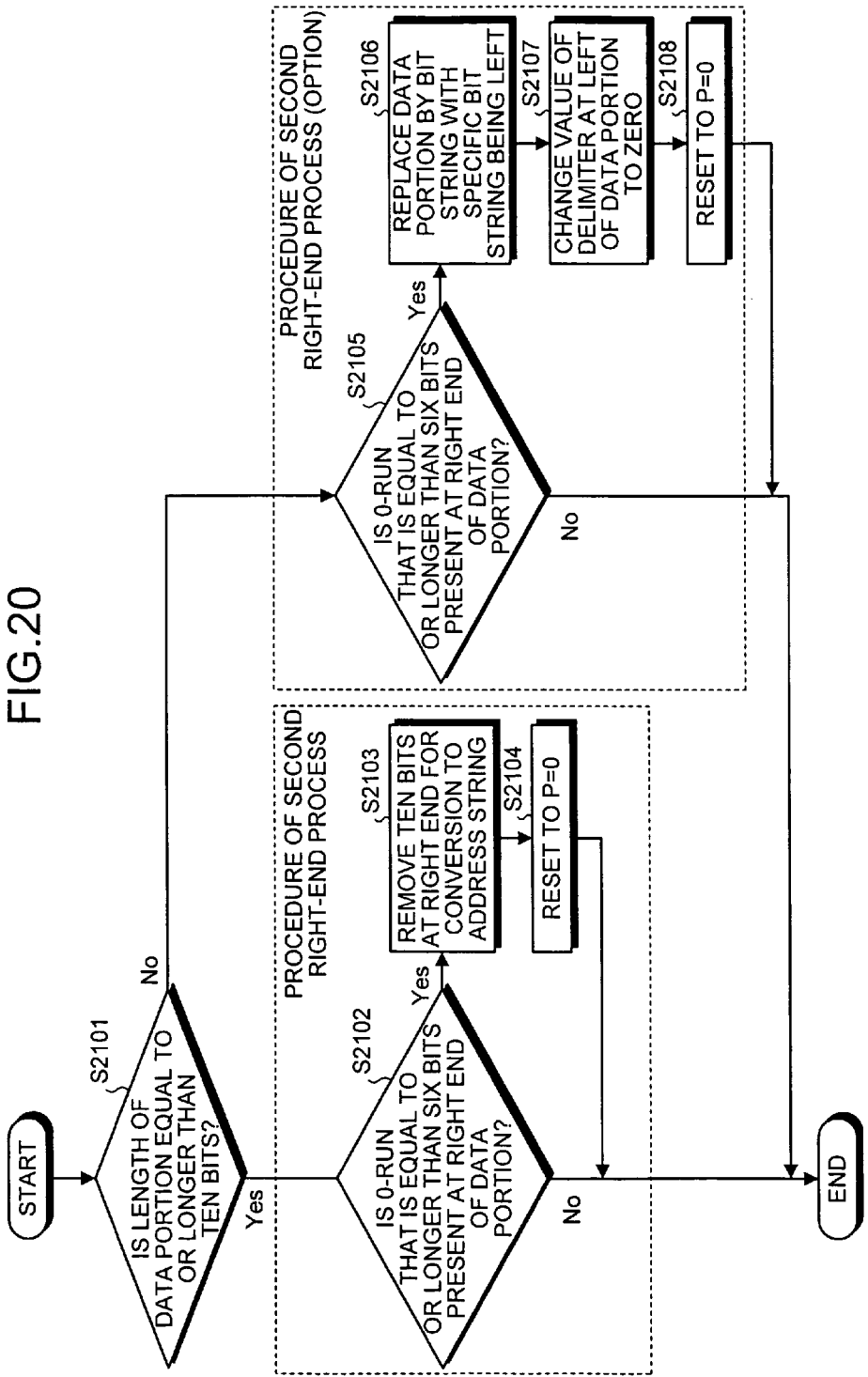
FIG. 20 is a flowchart of a process procedure for a second right-end process of the right-end process encoder (2) shown in FIG. 3.

FIG. 20 is a flowchart of a process procedure for a second right-end process of the right-end process encoder (2) 207g shown in FIG. 3. As shown in the drawing, the right-end process encoder (2) 207g checks to see whether the length of the data portion of the code bit string is equal to or longer than ten bits (step S2101).

As a result, if the length of the data portion of the code bit string is equal to or longer than ten bits ("YES" at step S2101), the right-end process encoder (2) 207g further checks to see whether a 0-run that is equal to or longer than six bits is present at the right end of the data portion of the code bit string (step S2102). As a result, if a 0-run that is equal to or longer than six bits is present at the right end of the data portion of the code bit string ("YES" at step S2102), the right-end-process encoder (2) 207g removes ten bits at the right end of the code bit string for conversion to an address string (step S2103), and then resets the pivot to P=0 (step S2104). If a 0-run that is equal to or longer than six bits is not present at the right end of the data portion of the code bit string ("NO" at step S2102), the right-end process encoder (2) 207g ends the procedure.

If the length of the data portion of the code bit string is shorter than ten bits ("NO" at step S2101), the right-end process encoder (2) 207g further checks to see whether a 0-run that is equal to or longer than six bits is present at the right end of the data portion of the code bit string (step S2105). As a result, if a 0-run that is equal to or longer than six bits is not present at the right end of the data portion of the code bit string ("NO" at step S2105), the right-end process encoder (2) 207g ends the procedure.

If a 0-run that is equal to or longer than six bits is present at the right end of the data portion of the code bit string ("YES" at step S2105), the right-end process encoder (2) 207g performs a right-end process of replacing the data portion by a data portion with a specific bit string being left (step S2106), and then changes the value of a delimiter at the left of the data portion to zero (step S2107). In this manner, according to this procedure, the right-end process encoder (2) 207g can perform conversion so that the I condition of constraint is satisfied and also the G condition of constraint between code bit strings is satisfied.

Figure 21:
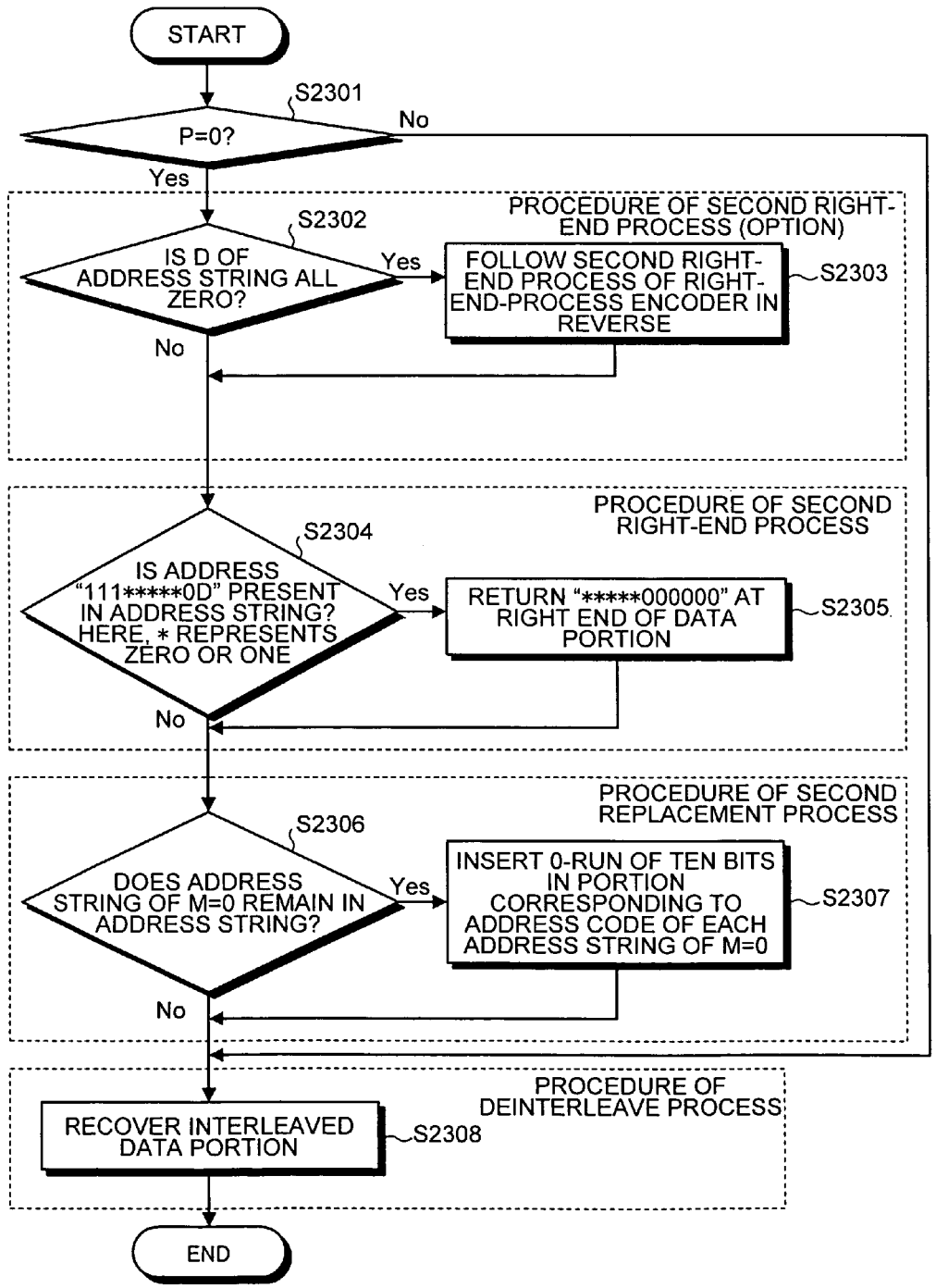
FIG. 21 is a flowchart of a process procedure for a second right-end process, a second replacement process, and a deinterleave process in a decoding process of the RLL decoder shown in FIG. 4.
Figure 22:
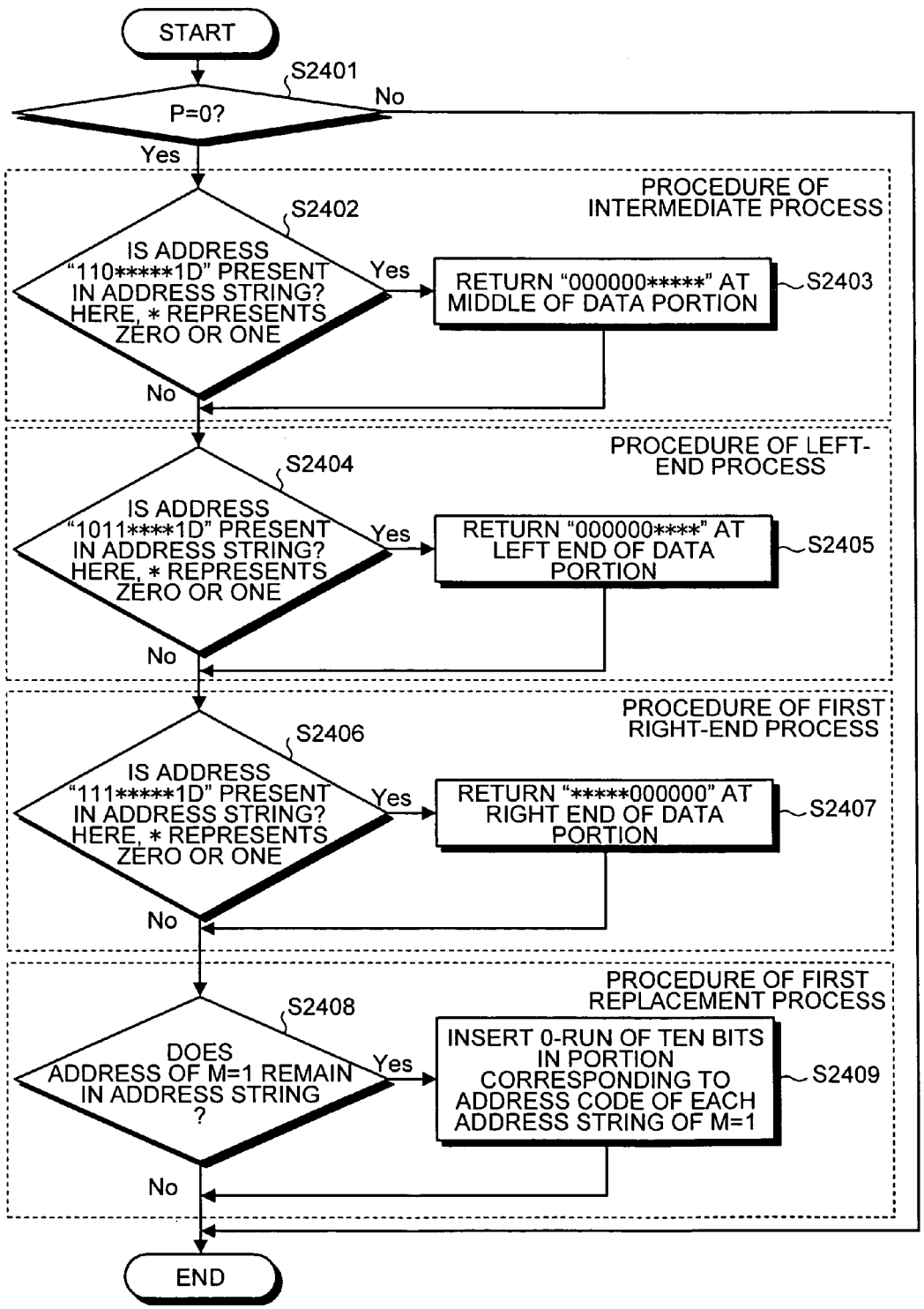
FIG. 22 is a flowchart of a process procedure of an intermediate process, a left-end process, a first right-end process, and a first replacement process of the RLL decoder shown in FIG. 4.

FIG. 21 is a flowchart of a process procedure for a second right-end process, a second replacement process, and a deinterleave process in a decoding process of the RLL decoder shown in FIG. 4. FIG. 22 is a flowchart of a process procedure of an intermediate process, a left-end process, a first right-end process, and a first replacement process of the RLL decoder shown in FIG. 4.

As shown in FIG. 21, the right-end-process decoder (2) 237b checks to see whether the pivot of the code bit string indicates P=0 (step S2301). As a result, if the pivot of the code bit string indicates P=1 ("NO" at step S2301), the right-end-process decoder (2) 237b goes to step S2308.

If the pivot of the code bit string indicates P=0 ("YES" at step S2301), the right-end-process decoder (2) 237b checks to see whether the delimiter D of the address string of the code bit string indicates all zero (step S2302). As a result, if the delimiter D of the address string of the code bit string indicates all zero ("YES" at step S2302), the right-end-process decoder (2) 237b follows the conversion through the procedure of the second right-end process performed by the right-end process encoder (2) 207g in reverse to recover the data portion(S2303).

If the delimiter D of the address string of the code bit string does not indicate all zero ("NO" at step S2302), the right-end-process decoder (2) 237b further checks to see whether "1111*****0D" is present in the address string of the code bit string (step S2304). Here, "*" represents zero or one. As a result, if "111***0D" is present in the address string of the code bit string ("YES" at step S2304), the right-end-process decoder (2) 237b returns "***000000" at the right end of the code bit string (step S2305).

If "111*****0D" is not present in the address string of the code bit string ("NO" at step S2304), the right-end-process decoder (2) 237b checks to see whether an address of M=0 remains in the address string of the code bit string (step S2306). As a result, if an address of M=0 remains in the address string of the code bit string ("YES" at step S2306), the replacement-method decoder (2) 237c inserts a 0-run of ten bits in a portion corresponding to the address code of each address string of M=0 (step S2307).

If an address of M=0 does not remain in the address string of the code bit string ("NO" at step S2306), the deinterleave decoder 237d recovers the interleaved data portion of the code bit string (step S2308). In this manner, according to the present procedures, a code bit string simultaneously satisfying the G condition of constraint and the I condition of constraint can be decoded to a code bit string satisfying the G condition of constraint.

As shown in FIG. 22, the intermediate-process decoder 237e checks to see whether the pivot of the code bit string indicates P=0 (step S2401). As a result, if the pivot of the code bit string indicates P=1 ("NO" at step S2401), the intermediate-process decoder 237e ends the procedure.

If the pivot of the code bit string indicates P=0 ("YES" at step S2401), the intermediate-process decoder 237e checks to see whether "110*****1D" is present in the address string of the code bit string (step S2402). Here, "*" represents zero or one. As a result, if "110***1D" is present in the address string of the code bit string ("YES" at step S2402), the intermediate-process decoder 237e returns "000000***" at the middle of the data portion of the code bit string (step S2403).

If "110***1D" is not present in the address string of the code bit string ("NO" at step S2402), the left-end-process decoder 237f further checks to see whether "10111D" is present in the address string of the code bit string (step S2404). As a result, if "101111D" is present in the address string of the code bit string ("YES" at step S2404), the left-end-process decoder 237f returns "000000**" at the left end of the data portion of the code bit string (step S2405).

If "1011**1D" is not present in the address string of the code bit string ("NO" at step S2404), the right-end-process decoder (1) 237g further checks to see whether "111*1D" is present in the address string of the code bit string (step S2406). As a result, if "1111*1D" is present in the address string of the code bit string ("YES" at step S2406), the right-end-process decoder (1) 237g returns "***000000" at the right end of the data portion of the code bit string (step S2407).

If "111*****1D" is not present in the address string of the code bit string ("NO" at step S2406), the replacement-method decoder (1) 237h further checks to see whether an address of M=1 remains in the address string of the code bit string (step S2408). As a result, if an address of M=1 remains in the address string of the code bit string ("YES" at step S2408), a 0-run of ten bits is inserted in a portion corresponding to the address code of each address string of M=1 (step S2409). If an address of M=1 does not remain in the address string of the code bit string ("NO" at step S2408), the replacement-method decoder (1) 237h ends the procedure. In this manner, according to the present procedures, a code bit string satisfying the G condition of constraint can be decoded to an information bit string.

As described above, according to the present embodiment, the RLL encoder 207 encodes an information bit string to a code bit string, which is RLL code at a high encoding rate satisfying a plurality of constraints regarding a 0-run. The RLL decoder 237 decodes the code bit string obtained through encoding by the RLL encoder 207 to an information bit string. Therefore, encoding and decoding can be performed on RLL code at a high encoding rate satisfying a plurality of constraints regarding a 0-run.

Also, the code bit string includes a pivot, which is data of one bit for identifying whether the information bit string includes a bit string violating the constraints, some address strings, which are bit string indicative of address information of the bit string violating the constraints, and a data string, which is data obtained by extracting the bit string violating the constraints from the information bits. The address string includes position information of the bit string violating the constraints, a marker indicative of the number of interleave processes on the data string, and a delimiter for identifying whether a bit string following the address string is an address string or the data string. The encoders 207a to 207d and 207f to 207g perform a replacement process of replacing the bit string violating the constraints by the address string. The interleave encoder 207e that performs an interleave process of dividing the data string into a plurality of bit strings, sequentially extracting a bit one by one from the plurality of bit strings, and sequentially arranging the extracted bits to generate a new bit string for replacement of the data string. The RLL encoder 207 alternately performs the replacement process and the interleave process a plurality of number of times to encode the information bit string to the code bit string satisfying the plurality of constraints. Therefore, the apparatus can be used for RLL code at a high encoding rate satisfying a plurality of constraints regarding a 0-run.

Furthermore, the RLL encoder 207 uses the information bit string for encoding to a code bit string simultaneously satisfying a G condition of constraint limiting a maximum number of bits of successive zeros in the information bit string and an I condition of constraint limiting a maximum number of bits of successive zeros regarding an even-numbered bit or an odd-numbered bit in the information bit string. Therefore, the apparatus can be used for RLL code at a high encoding rate simultaneously satisfying the G condition of constraint and the I condition of constraint.

Still further, the replacement-method encoder (1) 207a extracts a bit string of the maximum number of bits from the bit string violating the G condition of constraint of the information bit string and replaces the extracted bit string by the address string. Therefore, the information bit string can be encoded to a code bit string satisfying the G condition of constraint.

The right-end process encoder (1) 207b performs a right-end process of extracting, from the data string, a bit string of the maximum number of bits at a right end including a bit string of zeros at a right end having a possibility of violating the I condition of constraint and replaces the extracted bit string by the address string with a specific bit string of the bit string being left. Therefore, the information bit string can be encoded to a code bit string satisfying the I condition of constraint.

Still further, the left-end-process encoder 207c performs a left-end process of extracting, from the data string, a bit string of the maximum number of bits at a left end including a bit string of zeros at a left end having a possibility of violating the I condition of constraint, and replacing the extracted bit string by the address string with a specific bit string of the bit string being left. Therefore, the information bit can be encoded to a code bit string satisfying the I condition of constraint.

Still further, the intermediate-process encoder 207d performs an intermediate process of equally dividing the data string into two, extracting, at every boundary between data strings obtained through equal division, a bit string of the maximum number of bits including a bit string of zeros having a possibility of violating the I condition of constraint, and replacing the extracted bit string by the address string with a specific bit string of the bit string being left. The interleave encoder 207e performs an interleave process of extracting a bit one by one from each of the data strings obtained by the intermediate-process encoder 207d performing the intermediate process of equally dividing the data string into two, and sequentially arranging the extracted bits to generate a new bit string for replacement of the data string. Therefore, the information bit can be encoded to a code bit string satisfying the I condition of constraint.

Still further, the replacement-method encoder (2) 207f extracts, from the data string, a bit string of the maximum number of bits from the bit string violating the G condition of constraint, and replaces the extracted bit string by the address string of the bit string. Therefore, the information bit can be encoded to a code bit string simultaneously satisfying the G condition of constraint and the I condition of constraint.

Still further, the right-end process encoder (2) 207g performs a right-end process of extracting a bit string of the maximum number of bits including a bit string of zeros at a right end having a possibility of violating the G condition of constraint, and replacing the extracted bit string by the address string with a specific bit string of the bit string being left. Therefore, it is possible to achieve encoding to a code bit string at a high encoding rate simultaneously satisfying the G condition of constraint and the I condition of constraint between code bit strings.

Still further, when the data string is shorter than the maximum number of bits and the data string has a possibility of violating the G condition of constraint, the right-end process encoder (2) 207g performs a right-end process of changing a value of a delimiter of the address string at a left of the data string and replacing the data string by the data string with a specific bit string of the data string being left. Therefore, even an information bit string of a different number of bits can be encoded to a code bit string at a high encoding rate satisfying the same constraint.

Still further, when a bit string at a right end of the code bit string, the pivot of a code bit string at a right of the code bit string, and a bit string at a left end of the code bit string at the right of the code bit string violate the G condition of constraint, the right-end process encoder (2) 207g performs a right-end process of replacing the bit string at the right end by a specific address string, and then reverses the value of the pivot of the code bit string at the right. Therefore, constraint violation between the adjacent code bit strings can be prevented.

Here, while the embodiment of the present invention has been described, the present invention can be achieved by various different embodiments other than the embodiment described above within the scope of the technical ideas described in Scope of claims for Patent mentioned above.

For example, according to the present embodiment, the case has been described where an X condition of constraint with its predetermined number being two, that is, the 1 condition of constraint, is used for encoding has been described. This is not meant to be restrictive. The invention can be applied to a case where an X condition of constraint with its predetermined number being any number other than two, such as an X condition of constraint with its predetermined number being three or four, is used for encoding.

Also, in the present embodiment, the case has been described where the information bit string is 200 bits is described. This is not meant to be restrictive. The present embodiment can be applied to the case where the information bit string is other than 200 bits, that is, for example, when the information bit string is 207 bits or 208 bits.

According to the present invention, encoding and decoding can be performed on RLL code at a high encoding rate satisfying a plurality of constraints regarding a 0-run.

Furthermore, according to the present invention, the apparatus can be used for RLL code at a high encoding rate satisfying a plurality of constraints regarding a 0-run.

Moreover, according to the present invention, the apparatus can be used for RLL code at a high encoding rate simultaneously satisfying the G condition of constraint and the X condition of constraint.

Furthermore, according to the present invention, the information bit string can be encoded to a code bit string satisfying the G condition of constraint.

Moreover, according to the present invention, the information bit string can be encoded to a code bit string satisfying the X condition of constraint.

Furthermore, according to the present invention, the information bit can be encoded to a code bit string simultaneously satisfying the G condition of constraint and the X condition of constraint.

Moreover, according to the present invention, it is possible to achieve encoding to a code bit string at a high encoding rate simultaneously satisfying the G condition of constraint and the X condition of constraint between code bit strings.

Furthermore, according to the present invention, even an information bit string of a different number of bits can be encoded to a code bit string at a high encoding rate satisfying the same constraint.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A recording and reproducing apparatus comprising:
   an encoder that encodes an information bit string, which is a plurality of successive bits indicating an information language, to a code bit string, which is a plurality of successive bits indicating a code language; and
   a decoder that decodes the code bit string to the information bit string, wherein
   the encoder includes an encoding unit that encodes the information bit string to a code bit string that is a run-length-limited code satisfying a plurality of conditions of constraint regarding a string of successive zeros, and
   the decoder includes a decoding unit that decodes the code bit string encoded by the encoding unit to the information bit string wherein
   the encoding unit performs at least a replacement process to replace a bit string violating the conditions of constraint with an address string, the address string indicates address information of the bit string violating the conditions of constraint, and an interleave process to exchange a data string with a new bit string, the data string is obtained by excluding the bit string violating the conditions of the constraint from the information bit string and the new bit string is generated from the data string.

2. The recording and reproducing apparatus according to claim 1, wherein
   the code bit string is positioned at a head of a corresponding code bit, and includes
   a pivot of one bit data for determining whether the information bit string includes a bit string violating the conditions of constraint;
   the address string that indicates address information of the bit string violating the conditions of constraint; and
   the data string that is obtained by excluding the bit string violating the conditions of constraint from the information bit,
   the address string includes
   position information of the bit string violating the conditions of constraint;
   a marker that indicates a number of interleave processes conducted on the data string; and
   a delimiter that determines whether a bit string following the address string is another address string or the data string,
   the recording and reproducing apparatus further comprising:
   a replacement processing unit that replaces the bit string violating the conditions of constraint with the address string; and
   an interleave processing unit that divides the data string into a plurality of bit strings, sequentially extracts a bit one by one from the bit strings, sequentially arranges the extracted bits to generate a new bit string, and exchanges the data string with the new bit string, and
   the encoding unit alternately performs a replacement process by the replacement processing unit and an interleave process by the interleave processing unit a plurality of number of times to encode the information bit string to the code bit string that satisfies the conditions of constraint.

3. The recording and reproducing apparatus according to claim 1, wherein
   the conditions of constraint includes
   a G condition of constraint that limits a maximum number of bits of successive zeros in the information bit string; and
   an X condition of constraint that limits a maximum number of bits of successive zeros for every predetermined number of bits in the information bit string, and the encoding unit encodes the information bit string to the code bit string that satisfies both the G condition of constraint and the X condition of constraint.

4. The recording and reproducing apparatus according to claim 1, further comprising a first replacement processing unit that extracts a bit string of the maximum number of bits from the bit string violating the G condition of constraint, and replaces the bit string extracted with the address string, wherein
   the encoding unit uses the first replacement processing unit to encode the information bit string to the code bit string that satisfies the G condition of constraint.

5. The recording and reproducing apparatus according to claim 1, further comprising a first right-end processing unit that extracts a bit string of the maximum number of bits at a right end including a bit string of zeros at the right end having a possibility of violating the X condition of constraint from the data string, and replaces the bit string extracted with the address string that has a specific bit string of the bit string left, wherein
   the encoding unit uses the first right-end processing unit to encode the information bit string to the code bit string that satisfies the X condition of constraint.

6. The recording and reproducing apparatus according to claim 1, further comprising a left-end processing unit that extracts a bit string of the maximum number of bits at a left end including a bit string of zeros at the left end having a possibility of violating the X condition of constraint, and replaces the bit string extracted with the address string that has a specific bit string of the bit string left, wherein the encoding unit uses the left-end processing unit to encode the information bit string to the code bit string that satisfies the X condition of constraint.

7. The recording and reproducing apparatus according to claim 1, further comprising an intermediate processing unit that divides the data string into the predetermined number, extracts, at every boundary between data strings obtained through an equal division, a bit string of the maximum number of bits including .a bit string of zeros having a possibility of violating the X condition of constraint, and replaces the extracted bit string by the address string with a specific bit string of the bit string left; and an interleave processing unit that extracts a bit one by one from each of the data strings obtained by the intermediate processing unit performing an intermediate process of equally dividing the data string into the predetermined number, sequentially arranges the extracted bits to generate a new bit string, and exchanges of the data string with the new bit string, wherein the encoding unit uses the intermediate processing unit and the interleave processing unit to encode the information bit string to the code bit string that satisfies the X condition of constraint.

8. The recording and reproducing apparatus according to claim 1, further comprising a second replacement processing unit that extracts a bit string of the maximum number of bits from the bit string violating the G condition of constraint, and replaces the extracted bit string with the address string of the bit string, wherein the encoding unit uses the second replacement processing unit to encode the information bit string to the code bit string that satisfies both the G condition of constraint and the X condition of constraint.

9. The recording and reproducing apparatus according to claim 1, further comprising a second right-end processing unit that extracts a bit string of the maximum number of bits including a bit string of zeros at a right end having a possibility of violating the G condition of constraint from the data string, and replaces the extracted bit string with the address string with a specific bit string of the bit string left, wherein the encoding unit uses the second right-end processing unit to encode the information bit string to the code bit string that satisfies the C condition of constraint and the X condition of constraint between the code bit strings at a high encoding rate.

10. The recording and reproducing apparatus according to claim 1, wherein when the data string is less than the maximum number of bits and the data string has a possibility of violating the G condition of constraint, the second right-end processing unit changes a value of a delimiter of the address string at a left of the data string and replaces the data string with the data string with a specific bit string of the data string left.

11. The recording and reproducing apparatus according to claim I, wherein when a bit string at a right end of the code bit string, the pivot of a code bit string at a right of the code bit string, and a bit string at a left end of the code bit string at the right of the code bit string violate the G condition of constraint, the second right-end processing unit replaces the bit string at the right end with a specific address string, and then reverses the value of the pivot of the code bit string at the right.

12. The recording and reproducing apparatus according to claim 4, wherein the first and the second replacement processing units use an address-code conversion table, from which a bit string having a possibility of violating the G condition of constraint and the X condition of constraint is excluded, to generate the address string.

13. The recording and reproducing apparatus according to claim 8, wherein the first and the second replacement processing units use an address-code conversion table, from which a bit string having a possibility of violating the G condition of constraint and the X condition of constraint is excluded, to generate the address string.

14. A recording and reproducing method comprising:

encoding an information bit string, which is a plurality of successive bits indicating an information language, to a code bit string, which is a plurality of successive bits indicating a code language; and decoding the code bit string to the information bit string, wherein the encoding includes encoding the information bit string to a code bit string that is a run-length-limited code satisfying a plurality of conditions of constraint regarding a string of successive zeros, and the decoding includes decoding the code bit string encoded at the encoding to the information bit string; wherein the encoding includes performing at least a replacement process to replace a bit string violating the conditions of constraint with an address string, the address string indicates address information of the bit string violating the conditions of constraint, and an interleave process to exchange a data string with a new bit string, the data string is obtained by excluding the bit string violating the conditions of constraint from the information bit string and the new bit string is generated from the data string.

15. The recording and reproducing method according to claim 14, wherein the code bit string is positioned at a head of a corresponding code bit, and includes a pivot of one bit data for determining whether the information bit string includes a bit string violating the conditions of constraint;

the address string that indicates address information of the bit string violating the conditions of constraint; and the data string that is obtained by excluding the bit string violating the conditions of constraint from the information bit, the address string includes position information of the bit string violating the conditions of constraint;

a marker that indicates a number of interleave processes conducted on the data string; and a delimiter that determines whether a bit string following the address string is another address string or the data string, the recording and reproducing method further comprising:

replacing the bit string violating the conditions of constraint with the address string; and interleaving that includes dividing the data string into a plurality of bit strings;

extracting in sequence a bit one by one from the bit strings;

arranging in sequence the extracted bits to generate a new bit string; and exchanging the data string with the new bit string, and the encoding includes performing alternately the replacing and the interleaving a plurality of number of times to encode the information bit string to the code bit string that satisfies the conditions of constraint.

16. The recording and reproducing method according to claim 14, wherein the conditions of constraint includes a G condition of constraint that limits a maximum number of bits of successive zeros in the information bit string; and an X condition of constraint that limits a maximum number of bits of successive zeros for every predetermined number of bits in the information bit string, and the encoding includes encoding the information bit string to the code bit string that satisfies both the G condition of constraint and the X condition of constraint.

17. A computer-readable recording medium that stores a program making a computer execute:

encoding an information bit string, which is a plurality of successive bits indicating an information language, to a code bit string, which is a plurality of successive bits indicating a code language; and decoding the code bit string to the information bit string, wherein the encoding includes encoding the information bit string to a code bit string that is a run-length-limited code satisfying a plurality of conditions of constraint regarding a string of successive zeros, and the decoding includes decoding the code bit string encoded at the encoding to the information bit string wherein the encoding includes performing at least a replacement process to replace a bit string violating the conditions of constraint with an address string, the address string indicates address information of the bit string violating the conditions of constraint, and an interleave process to exchange a data string with a new bit string, the data string is obtained by excluding the bit string violating the conditions of constraint from the information bit string and the new bit string is generated from the data string.

18. The computer-readable recording medium according to claim 17, wherein the code bit string is positioned at a head of a corresponding code bit, and includes a pivot of one bit data for determining whether the information bit string includes a bit string violating the conditions of constraint;

the address string that indicates address information of the bit string violating the conditions of constraint; and the data string that is obtained by excluding the bit string violating the conditions of constraint from the information bit, the address string includes position information of the bit string violating the conditions of constraint;

a marker that indicates a number of interleave processes conducted on the data string; and a delimiter that determines whether a bit string following the address string is another address string or the data string, the computer program further making the computer execute:

replacing the bit string violating the conditions of constraint with the address string; and interleaving that includes dividing the data string into a plurality of bit strings;

extracting in sequence a bit one by one from the bit strings;

arranging in sequence the extracted bits to generate a new bit string; and exchanging the data string with the new bit string, and the encoding includes performing alternately the replacing and the interleaving a plurality of number of times to encode the information bit string to the code bit string that satisfies the conditions of constraint.

19. The computer-readable recording medium according to claim 17, wherein the conditions of constraint includes a G condition of constraint that limits a maximum number of bits of successive zeros in the information bit string; and an X condition of constraint that limits a maximum number of bits of successive zeros for every predetermined number of bits in the information bit string, and the encoding includes encoding the information bit string to the code bit string that satisfies both the G condition of constraint and the X condition of constraint.

20. The recording and reproducing apparatus according to claim 1, wherein the encoding unit encodes by excluding a bit string violating the conditions of constraint regarding a string of successive zeros and replaces the bit string with an address information of the bit string.

21. The recording and reproducing method according to claim 14, wherein the encoding includes encoding by excluding a bit string violating the conditions of constraint regarding a string of successive zeros and replaces the bit string with an address information of the bit string.

22. The computer-readable recording medium according to claim 17, wherein the encoding includes encoding by excluding a bit string violating the conditions of constraint regarding a string of successive zeros and replaces the bit string with an address information of the bit string.

* * * * *